US012713787B2

(12) United States Patent
Lee et al.

(10) Patent No.: US 12,713,787 B2
(45) Date of Patent: Aug. 18, 2026

(54) DISPLAY DEVICE INCLUDING A LIGHT BLOCKING PATTERN

(71) Applicant: SAMSUNG DISPLAY CO., LTD., Yongin-si (KR)

(72) Inventors: Hyeonbum Lee, Hwaseong-si (KR); Beohmrock Choi, Seoul (KR); Chiwook An, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 1005 days.

(21) Appl. No.: 17/885,507

(22) Filed: Aug. 10, 2022

(65) Prior Publication Data

US 2023/0126210 A1 Apr. 27, 2023

(30) Foreign Application Priority Data

Oct. 27, 2021 (KR) ........................ 10-2021-0144326

(51) Int. Cl.
*H10K 59/126* (2023.01)

(52) U.S. Cl.
CPC .................................. *H10K 59/126* (2023.02)

(58) Field of Classification Search
None
See application file for complete search history.

(56) References Cited

U.S. PATENT DOCUMENTS 10,804,340 B2 10/2020 Lee et al.
10,831,294 B2 11/2020 Kim et al.
10,847,586 B2 11/2020 Lee
11,075,364 B2 7/2021 Kim et al.
2011/0050666 A1* 3/2011 Inoue .................. G09G 3/3233 345/76
2016/0109750 A1 4/2016 Kim et al.
2017/0278899 A1* 9/2017 Yang .................. H10K 59/8731
2019/0214440 A1* 7/2019 Lee ...................... H10K 59/122
2020/0168671 A1* 5/2020 Jang ...................... G06F 3/0443
2022/0262865 A1* 8/2022 Hou ...................... H10K 59/40

FOREIGN PATENT DOCUMENTS

KR 10-2006-0026243 A 3/2006
KR 10-2007-0078304 7/2007
KR 10-0998695 11/2010
KR 10-2016-0047032 A 5/2016
(Continued)

*Primary Examiner* — Jessica S Manno
*Assistant Examiner* — Christopher A. Schodde
(74) *Attorney, Agent, or Firm* — F. CHAU & ASSOCIATES, LLC

(57) ABSTRACT

A display device includes first and second areas. The second area includes a display panel including a plurality of light emitting areas respectively overlapping element areas and a non-light-emitting area at least partially surrounding the light emitting areas such that at least a portion of the non-light-emitting area overlaps a peripheral area. A lower cover layer is disposed on the display panel, overlapping the first area and the second area, and including cover patterns respectively overlapping the light emitting areas of the second area. A light blocking pattern is disposed on the lower cover layer overlapping the second area. The light blocking pattern covers a portion of an upper surface of each of the cover patterns.

16 Claims, 18 Drawing Sheets

(56) References Cited

FOREIGN PATENT DOCUMENTS

| | | | |
|---|---|---|---|
| KR | 10-2019-0042787 | A | 4/2019 |
| KR | 10-2019-0080312 | A | 7/2019 |
| KR | 10-2019-0085191 | | 7/2019 |
| KR | 10-2020-0039859 | A | 4/2020 |
| KR | 10-2020-0063591 | | 6/2020 |
| KR | 10-2020-0081911 | | 7/2020 |

* cited by examiner

Figure 13:
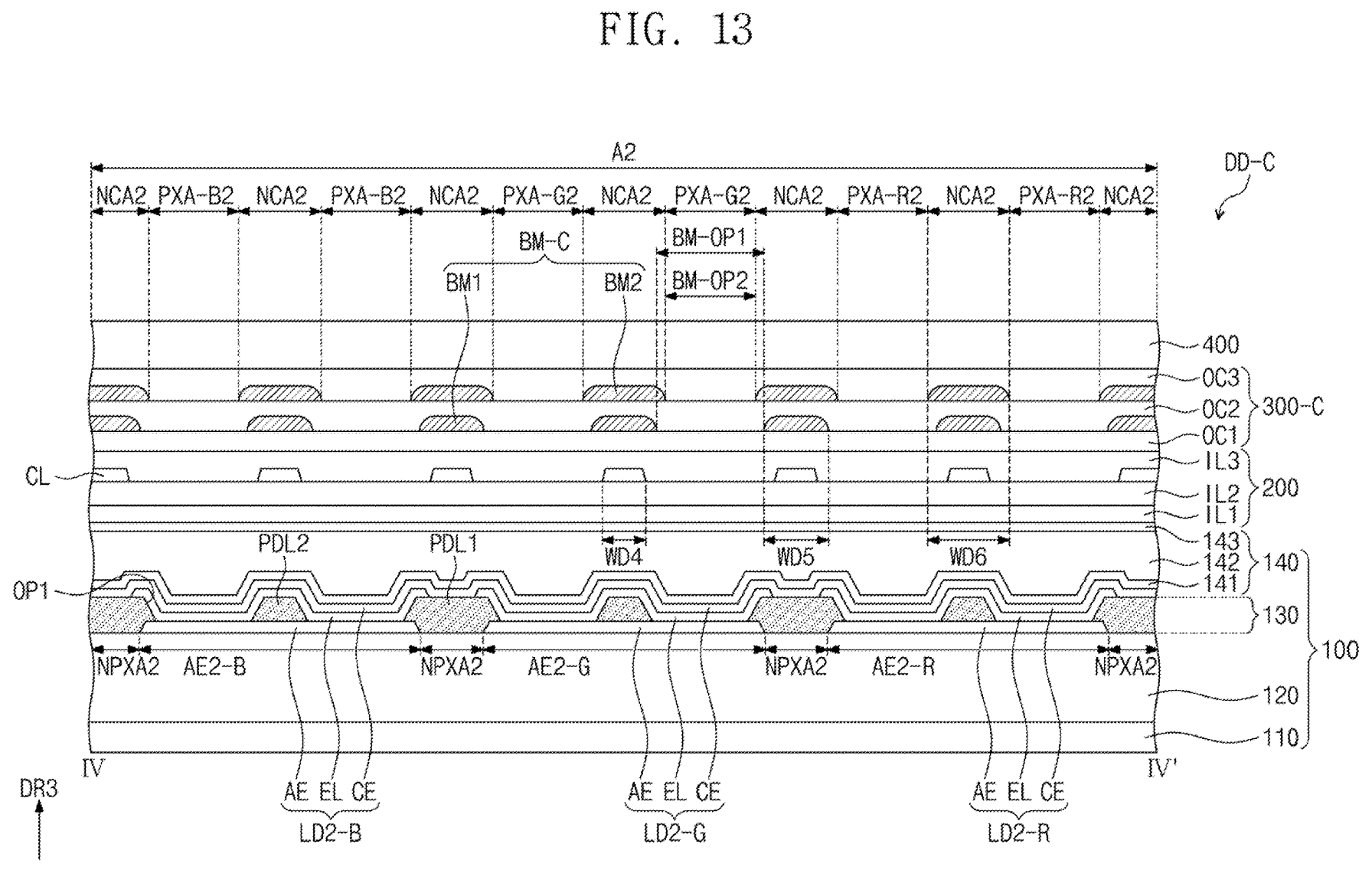

DD-C A2 NCA2 PXA-R2 NCA2 PXA-R2 NCA2 PXA-G2 NCA2 PXA-G2 NCA2 PXA-B2 NCA2 PXA-B2 NCA2 BM-OP1 BM-OP2 BM2 BM-C BM1 400 OC3 300-C OC2 OC1 IL3 200 IL2 IL1 143 140 142 141 130 100 120 110 IV' IV WD6 WD5 WD4 PDL1 PDL2 NPXA2 AE EL CE LD2-R AE2-R LD2-G AE2-G LD2-B AE2-B CL OP1 DR3

DISPLAY DEVICE INCLUDING A LIGHT BLOCKING PATTERN

This U.S. non-provisional patent application claims priority under 35 U.S.C. § 119 to Korean Patent Application No. 10-2021-0144326, filed on Oct. 27, 2021, the contents of which are hereby incorporated by reference in its entirety.

TECHNICAL FIELD

The present disclosure relates to a display device. More particularly, the present disclosure relates to a display device including a light blocking pattern.

DISCUSSION OF THE RELATED ART

Electronic devices, such as smartphones, tablet computers, notebook computers, car navigation units, smart televisions, etc., are being developed. These electronic devices often include a display device to provide visual information to a user.

Display devices have been developed to meet a wide range of use cases. For example, some display devices have been developed for providing brighter images, particularly for outdoor use. Additionally, display devices for providing a narrow viewing angle for use in displaying personal information to a user have been developed.

SUMMARY

A display device includes a display panel including first and second areas each including a peripheral area and element areas in which light emitting elements providing different color light are disposed. A lower cover layer is disposed on the display panel, at least partially overlapping the first area and the second area, and including cover patterns respectively overlapping the light emitting areas of the second area. A light blocking pattern at least partially overlaps the non-light-emitting area and is disposed on the lower cover layer overlapping the second area. The second area includes a plurality of light emitting areas respectively overlapping the element areas and a non-light-emitting area at least partially surrounding the light emitting areas such that at least a portion of the non-light-emitting area overlaps the peripheral area. The light blocking pattern covers a portion of an upper surface of each of the cover patterns.

The light blocking pattern may have a width that varies along a thickness direction of the display panel.

An upper surface of the light blocking pattern may have a concave shape that is concaved toward the display panel.

The display device may further include an input sensor disposed between the display panel and the lower cover layer and including sensing electrodes overlapping the peripheral area and sensing insulating layers.

The light blocking pattern may be in contact with an uppermost sensing insulating layer closest to the lower cover layer among the sensing insulating layers.

The sensing electrodes may have a width that is smaller than a maximum width of the light blocking pattern.

At least a portion of the light blocking pattern may be disposed in the lower cover layer, and the light blocking pattern may be spaced apart from an uppermost sensing insulating layer closest to the lower cover layer among the sensing insulating layers.

The display device may further include an additional cover layer disposed between an uppermost sensing insulating layer closest to the lower cover layer among the sensing insulating layers and the lower cover layer. The light blocking pattern may be in contact with the additional cover layer.

The sensing electrodes might not overlap a portion between the light emitting areas adjacent to each other among the light emitting areas.

The light blocking pattern may have a grid shape in which light blocking openings overlap the light emitting areas, and each of the cover patterns overlaps a corresponding light blocking opening among the light blocking openings.

The light emitting areas of the second area may have a same size as each other.

Each of the light emitting elements may include a first electrode, a second electrode, and a light emitting layer disposed between the first electrode and the second electrode. The display panel may include a first pixel definition layer through which openings expose at least a portion of each of the first electrodes.

The display panel of the second area may include a second pixel definition layer disposed on the first electrodes exposed through the openings and overlapping the non-light-emitting area.

The first area may include a plurality of light emitting areas respectively overlapping the element areas and a non-light-emitting area at least partially surrounding the light emitting areas such that at least a portion of the non-light-emitting area overlaps the peripheral area.

The light emitting areas of the first area may have a same size as each other.

The display panel may be configured to activate the light emitting elements of the first area and the light emitting elements of the second area in a first operation mode, deactivate the light emitting elements of the first area in a second operation mode, and activate the light emitting elements of the second area in the second operation mode.

A display device includes a display panel including first and second areas each including a peripheral area and element areas in which light emitting elements providing different color light from each other are disposed. A first light blocking pattern at least partially overlaps a non-light-emitting area. A second light blocking pattern overlaps the first light blocking pattern and is disposed farther from the display panel than the first light blocking pattern is. The second area includes a plurality of light emitting areas respectively overlapping the element areas and the non-light-emitting area at least partially surrounding the light emitting areas such that at least a portion of the non-light-emitting area overlaps the peripheral area. A maximum width of the first light blocking pattern is smaller than a minimum width of the second light blocking pattern.

The display device may further include an input sensor disposed between the display panel and the first light blocking pattern and including sensing electrodes at least partially overlapping the peripheral area and sensing insulating layers. A maximum width of the sensing electrodes may be smaller than a width of the first light blocking pattern.

The display device may further include a first cover layer disposed on the input sensor and provided with the first light blocking pattern disposed thereon, a second cover layer disposed on the first cover layer and covering the first light blocking pattern, and a third cover layer disposed on the second cover layer and covering the second light blocking pattern. Each of the first, second, and third cover layers may include an organic material.

The organic material may include an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin.

BRIEF DESCRIPTION OF THE DRAWINGS

The above and other aspects of the present disclosure will become readily apparent by reference to the following detailed description when considered in conjunction with the accompanying drawings, wherein:

FIG. 9 is a cross-sectional view taken along a line IV-IV' of FIGS. 6B and 7;

FIG. 13 is a cross-sectional view of a display device according to an embodiment of the present disclosure.

DETAILED DESCRIPTION

Figure 1:
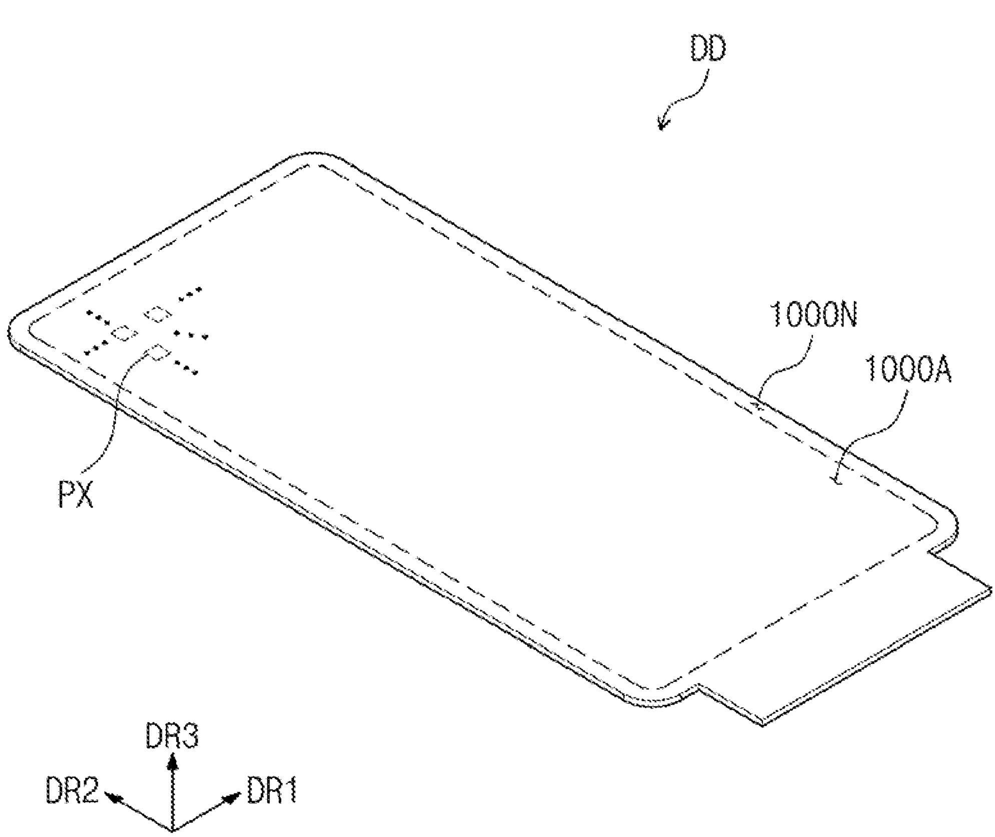
FIG. 1 is a perspective view of a display device according to an embodiment of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals may refer to like elements throughout the specification and the drawings. In the drawings, the thickness, ratio, and dimension of components shown in the figures are intended to represent at least one embodiment of the present disclosure, however, it is to be understood that these thicknesses, ratios, and dimensions may be modified within the spirit and scope of the present disclosure. As used herein, the term "and/or" includes any and all combinations of one or more of the associated listed items.

It will be understood that, although the terms first, second, etc., may be used herein to describe various elements, these elements should not necessarily be limited by these terms. These terms may be used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, embodiments of the present disclosure will be described with reference to accompanying drawings.

Figure 2:
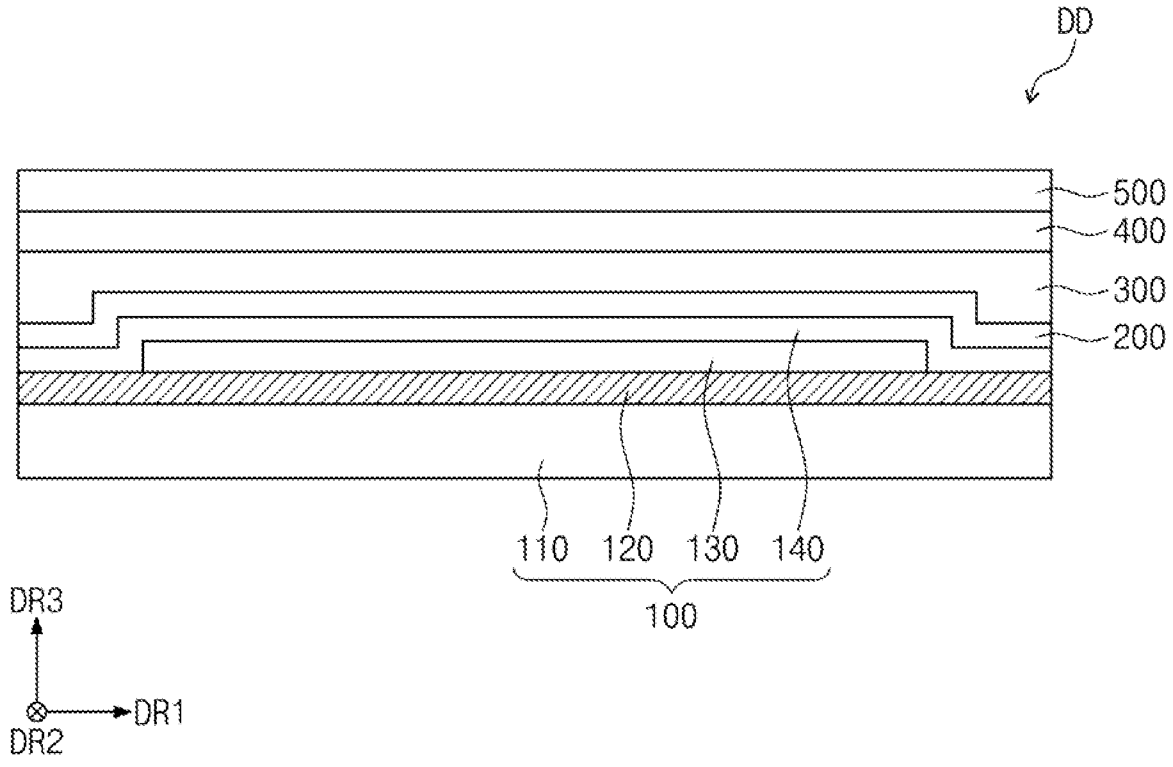
FIG. 2 is a cross-sectional view of a display device according to an embodiment of the present disclosure.
Figure 3:
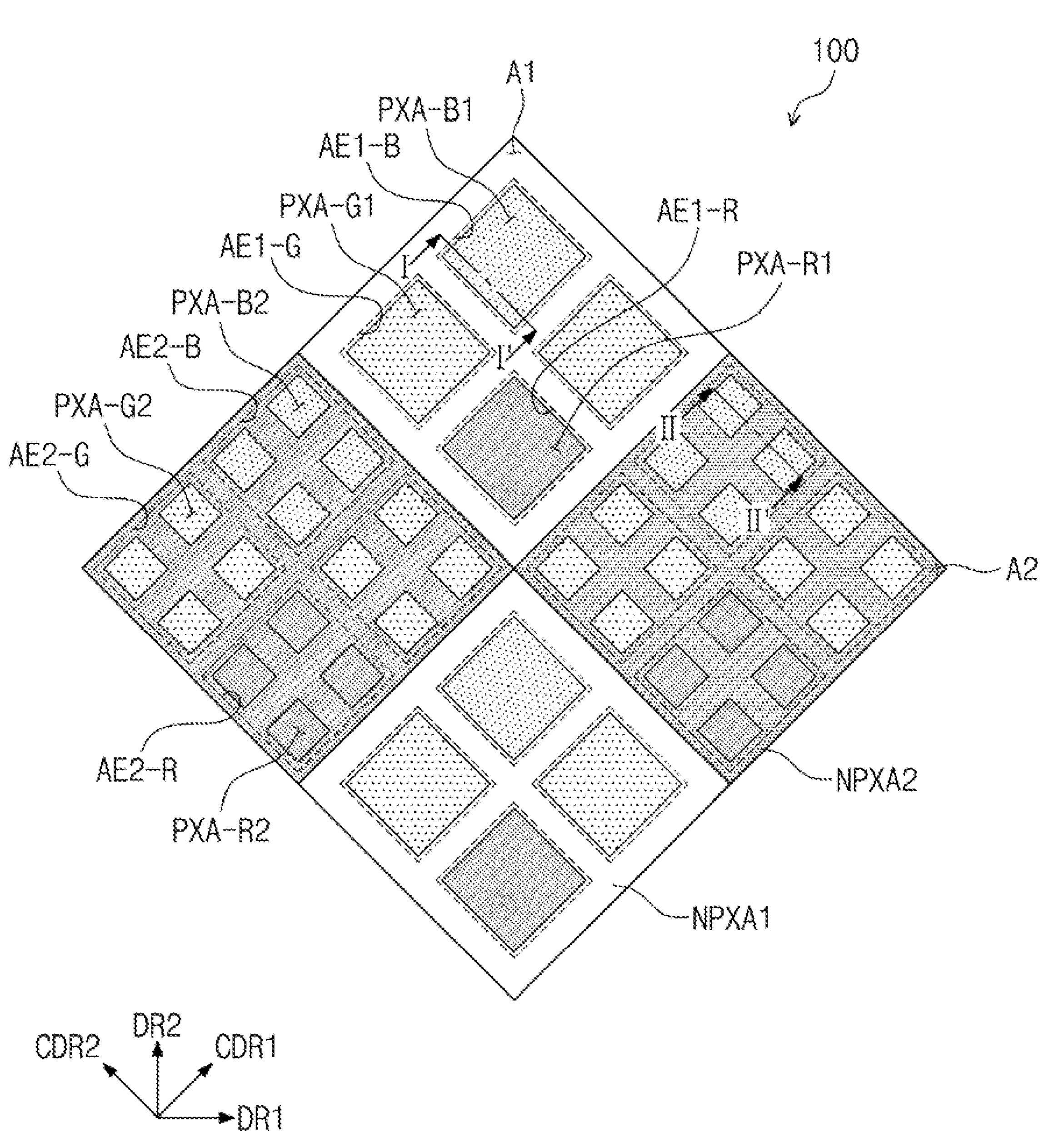
FIG. 3 is a plan view of a display panel according to an embodiment of the present disclosure.
Figure 4A:
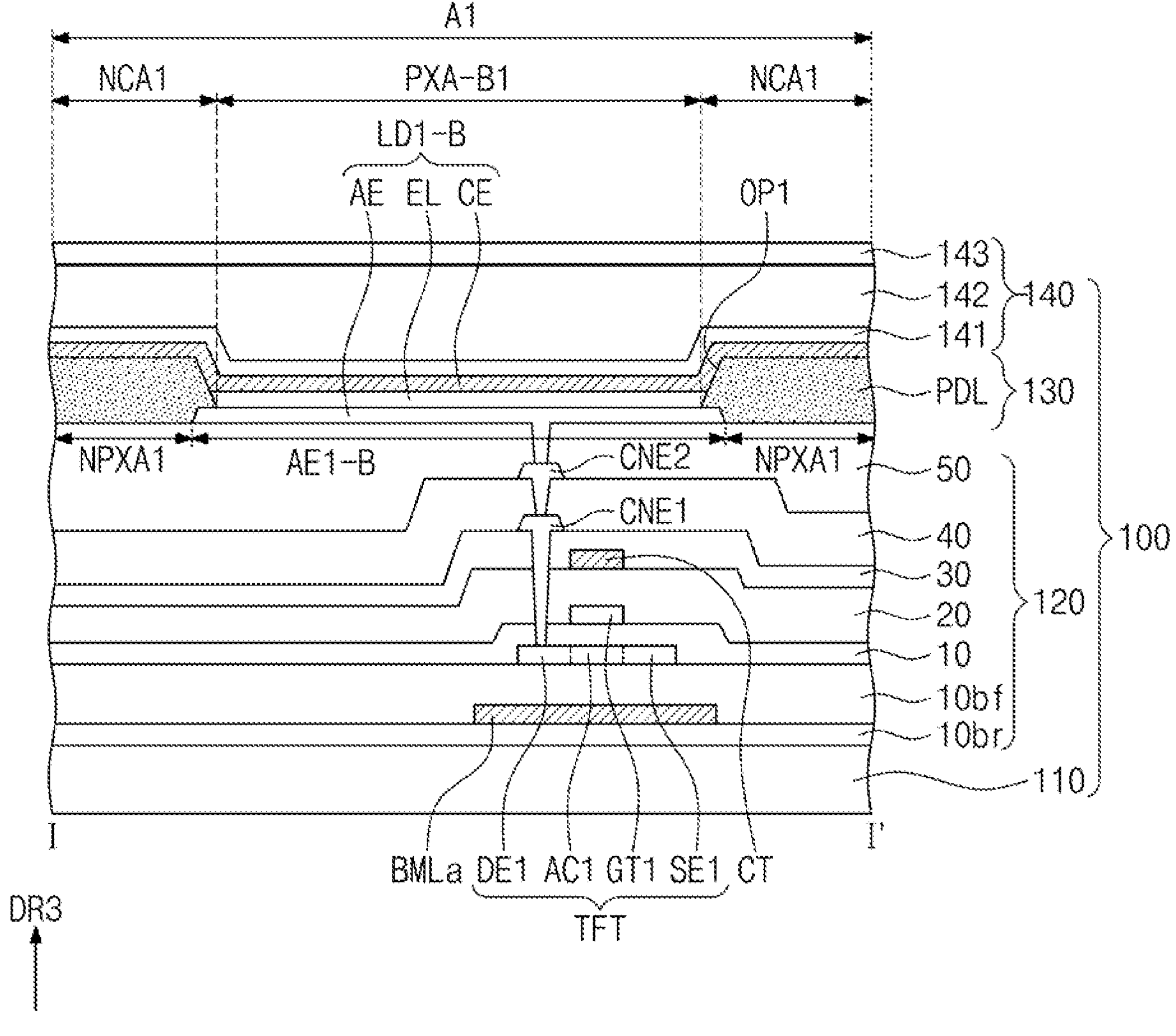
FIG. 4A is a cross-sectional view taken along a line I-I' of FIG. 3.
Figure 4B:
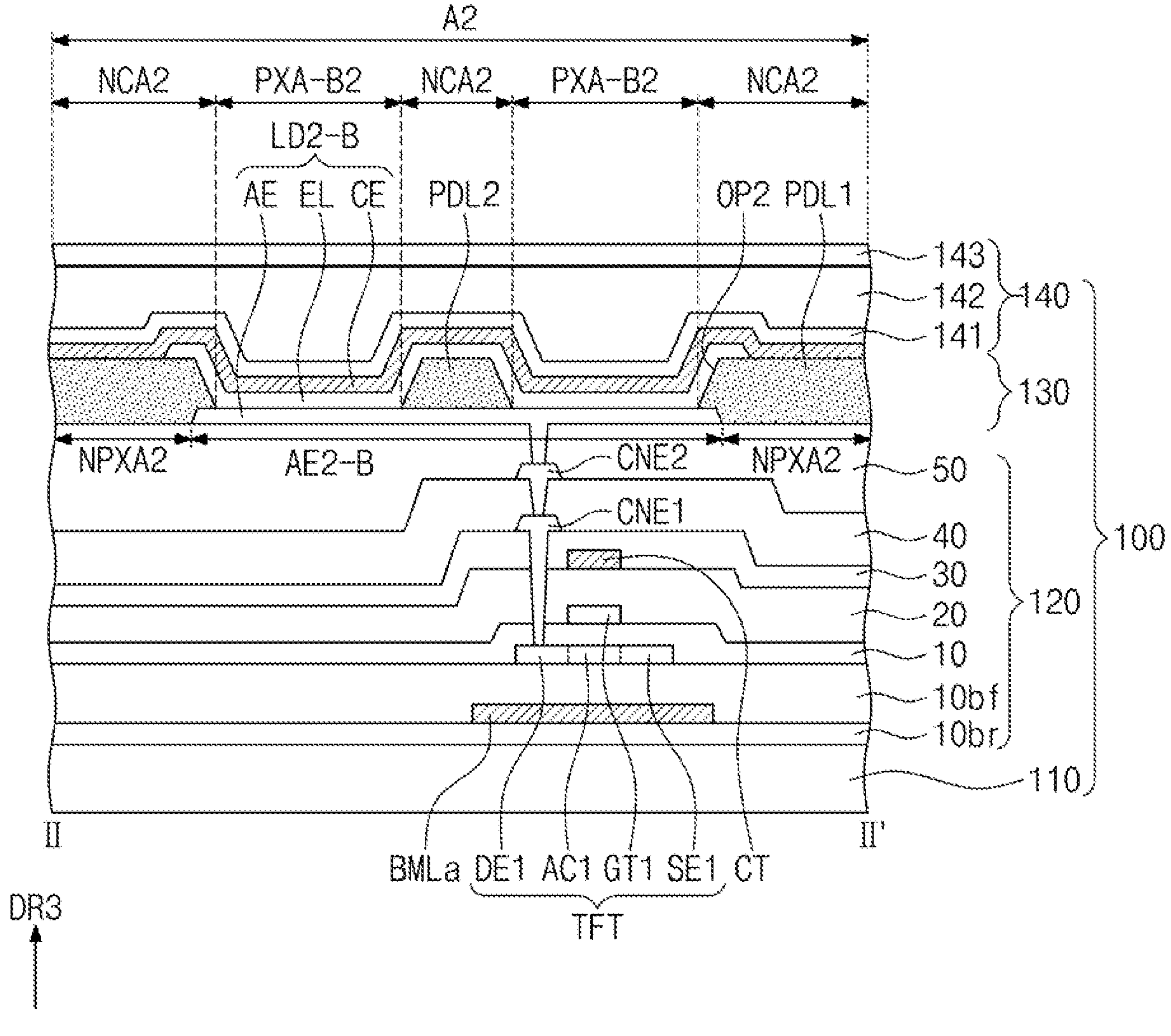
FIG. 4B is a cross-sectional view taken along a line II-II' of FIG. 3.

FIG. 1 is a perspective view of a display device DD according to an embodiment of the present disclosure. FIG. 2 is a cross-sectional view of the display device DD according to an embodiment of the present disclosure. FIG. 3 is a plan view of a portion of a display panel according to an embodiment of the present disclosure. FIG. 4A is a cross-sectional view taken along a line I-I' of FIG. 3. FIG. 4B is a cross-sectional view taken along a line II-II' of FIG. 3.

FIG. 1 is a perspective view of the display device DD according to an embodiment of the present disclosure.

The display device DD may generate an image and may sense an external input such as a touch. The display device DD may include a display area 1000A and a non-display area 1000N at least partially surrounding the display area 1000A. A pixel PX may be disposed in the display area 1000A. The pixel PX may include a first color sub-pixel, a second color sub-pixel, and a third color sub-pixel, each of which generates light of different colors. There may be a plurality of pixels PX within the display area 1000A and some pixels PX are illustrated as an example.

An image may be displayed in the display area 1000A. The display area 1000A may occupy a plane defined by a first direction DR1 and a second direction DR2. The display device DD may display an image in the third direction DR3 through the display area 1000A having a display surface that is parallel to the plane. The third direction DR3 may be substantially parallel to the normal direction of the display surface.

The display area 1000A may further include curved surfaces bent from at least two sides of the plane. However, the shape of the display area 1000A should not necessarily be limited thereto or thereby. As an example, the display area 1000A may include only the plane, or the display area 1000A may further include two or more curved surfaces, e.g., four curved surfaces respectively bent from four sides of the plane.

FIG. 2 is a cross-sectional view of the display device DD according to an embodiment of the present disclosure. Referring to FIG. 2, the display device DD may include a display panel 100, an input sensor 200, a light control layer 300, an anti-reflective layer 400, and a window 500.

The display panel 100 may be a light emitting type display panel. For example, the display panel 100 may be an organic light emitting diode (OLED) display panel, an inorganic light emitting display panel, a micro-LED display panel, a nano-LED display panel, or a quantum dot display panel. The display panel 100 may include a base layer 110, a circuit layer 120, a light emitting element layer 130, and an encapsulation layer 140.

The base layer 110 may provide a base surface on which the circuit layer 120 is disposed. The base layer 110 may be a rigid substrate or a flexible substrate that is bendable, foldable, or rollable to a noticeable degree without cracking or otherwise sustaining damage. The base layer 110 may be a glass substrate, a metal substrate, or a polymer substrate, however, it should not necessarily be limited thereto or thereby. According to an embodiment, the base layer 110 may be an inorganic layer, an organic layer, or a composite material layer.

The base layer 110 may have a multi-layer structure. For instance, the base layer 110 may include a first synthetic resin layer, an inorganic layer having a single-layer or multi-layer structure, and a second synthetic resin layer disposed on top of the inorganic layer having the single-layer or multi-layer structure. Each of the first and second synthetic resin layers may include a polyimide-based resin, however, it should not necessarily be particularly limited.

The circuit layer 120 may be disposed on top of the base layer 110. The circuit layer 120 may include an insulating layer, a semiconductor pattern, a conductive pattern, and a signal line. The circuit layer 120 may include a driving circuit of the pixel PX described with reference to FIG. 1.

The light emitting element layer 130 may be disposed on top of the circuit layer 120. The light emitting element layer 130 may include a light emitting element of the pixel PX described with reference to FIG. 1. For example, the light emitting element may include an organic light emitting material, an inorganic light emitting material, an organic-inorganic light emitting material, a quantum dot, a quantum rod, a micro-LED, or a nano-LED.

The encapsulation layer 140 may be disposed on top of the light emitting element layer 130. The encapsulation layer 140 may protect the light emitting element layer 130 from ambient moisture, oxygen, and a foreign substance such as dust particles. The encapsulation layer 140 may include at least an inorganic layer or an organic layer. According to an embodiment, the encapsulation layer 140 may include two inorganic layers and an organic layer disposed between the two inorganic layers.

The input sensor 200 may be disposed on top of the display panel 100. The input sensor 200 may sense an external input applied thereto from the outside. The external input may include a variety of external inputs, such as a touch from a part of user's body (e.g., a finger), light, heat, a touch from a pen/stylus, or pressure.

The input sensor 200 may be formed on the display panel 100 through successive processes. In this case, the input sensor 200 may be disposed directly on top of the display panel 100. In the present disclosure, the expression "a component A is disposed directly on a component B" means that no intervening elements are present between the component A and the component B. For example, an adhesive layer might not be disposed between the input sensor 200 and the display panel 100.

The light control layer 300 may be disposed on top of the input sensor 200. The light control layer 300 may control an emission rate of a light provided from the light emitting element layer 130 to correspond to areas of the display panel 100. The light control layer 300 will be described in detail later.

The anti-reflective layer 400 may be disposed on top of the light control layer 300. The anti-reflective layer 400 may be coupled to the light control layer 300 by an adhesive layer. The adhesive layer may be a pressure sensitive adhesive (PSA) film or an optically clear adhesive (OCA).

The anti-reflective layer 400 may reduce a reflectance of ambient light. The anti-reflective layer 400 may include an optical film. The optical film may include a polarizing film. The optical film may further include a retarder film. The retarder film may include a λ/2 retarder film and/or a λ/4 retarder film.

The window 500 may include at least one base layer. The base layer may be a glass substrate or a synthetic resin film. The window 500 may have a multi-layer structure. The window 500 may include a thin film glass substrate and a synthetic resin film disposed on top of the thin film glass substrate. The thin film glass substrate may be coupled to the synthetic resin film by an adhesive layer, and the adhesive layer and the synthetic resin film may be separated from the thin film glass substrate to allow for the thin film glass substrate be replaced. The window 500 may further include a functional layer disposed on top of the base layer. The functional layer may include an anti-reflective layer, an anti-fingerprint layer, or the like.

FIG. 3 shows element areas included in different areas of the display panel 100. The display panel 100 may include a first area A1 and a second area A2. The first area A1 and the second area A2 may be spaced apart from each other in first and second diagonal directions CDR1 and CDR2. The first area A1 may be provided in plural, and the first areas A1 may be spaced apart from each other in the second direction DR2. The second area A2 may be provided in plural, and the second areas A2 may be spaced apart from each other in the first direction DR1. The first areas and the second areas may be arranged in the display area 1000A (refer to FIG. 1) in an arrangement shown in FIG. 3.

The first area A1 may include first-first, first-second, and first-third element areas AB1-B, AE1-G, and AE1-R and a first peripheral area NPXA1. The first peripheral area NPXA1 may at least partially surround the first-first, first-second, and first-third element areas AE1-B, AE1-G, and AE1-R.

In the present disclosure, each of the first-first, first-second, and first-third element areas AE1-B, AE1-G, and AE1-R may be an area in which a first electrode included in light emitting elements providing light having different colors from each other is disposed. Accordingly, the first peripheral area NPXA1 may be an area between the first electrodes included in the light emitting elements.

As an example, the first-first element area AE1-B may be an area in which a first electrode AE of a first-first light emitting element LD1-B providing a light having a first color is disposed as shown in FIG. 4A.

The first area A1 of the display panel 100 may include a first-first light emitting area PXA-B1 that is an area from which the light generated by the first-first light emitting element LD1-B substantially exits.

The first-second element area AE1-G may be an area in which a first electrode AE of a first-second light emitting element LD1-G (refer to FIG. 8) providing a light having a second color is disposed.

The first area A1 of the display panel 100 may include a first-second light emitting area PXA-G1 that is an area from which the light generated by the first-second light emitting element LD1-G substantially exits.

The first-third element area AE1-R may be an area in which a first electrode AE of a first-third light emitting element LD1-R (refer to FIG. 8) providing a light having a third color is disposed.

The first area A1 of the display panel 100 may include a first-third light emitting area PXA-R1 that is an area from which the light generated by the first-third light emitting element LD1-R substantially exits.

In the present embodiment, each of the first-first light emitting area PXA-B1, the first-second light emitting area PXA-G1, and the first-third light emitting area PXA-R1 of the first area A1 may correspond to a size of a corresponding opening among first openings OP1 (refer to FIG. 4A) defined through a pixel definition layer PDL (refer to FIG. 4A) disposed in the first area A1. In addition, a first non-light-emitting area NCA1 may be an area overlapping the pixel definition layer PDL.

The second area A2 may include second-first, second-second, and second-third element areas AE2-B. AE2-G, and AE2-R and a second peripheral area NPXA2. The second peripheral area NPXA2 may at least partially surround the second-first, second-second, and second-third element areas AE2-B, AE2-G, and AE2-R.

In the present disclosure, each of the second-first, second-second, and second-third element areas AE2-B, AE2-G, and AE2-R may be an area in which the first electrode included in the light emitting elements providing the light having different colors from each other is provided. Accordingly, the second peripheral area NPXA2 may be an area between the first electrodes included in the light emitting elements.

As an example, the second-first element area AE2-B may be an area in which a first electrode AE of a second-first light emitting element LD2-B providing the light having the first color is disposed as shown in FIG. 4B.

The second area A2 of the display panel 100 may include second-first light emitting areas PXA-B2 each being an area from which the light generated by the second-first light emitting element LD2-B substantially exits.

According to the present embodiment, four second-first light emitting areas PXA-B2 may be provided and may be spaced apart from each other in the first direction DR1 and the second direction DR2 or in the first diagonal direction CDR1 and the second diagonal direction CDR2.

The second-second element area AE2-G may be an area in which a first electrode AE of a second-second light emitting element LD2-G (refer to FIG. 9) providing the light having the second color is disposed.

According to the present embodiment, two second-second element areas AE2-G may be provided in one second area A2. The two second-second element areas AE2-G may be spaced apart from each other in the first direction DR1.

The second area A2 of the display panel 100 may include the second-second light emitting areas PXA-G2 each being an area from which the light generated by the second-second light emitting element LD2-G substantially exits, and the second-second light emitting areas PXA-G2 may be grouped into two groups.

The second-second light emitting areas PXA-G2 of a first group may overlap one second-second element area AE2-G, and the second-second light emitting areas PXA-G2 of a second group may overlap the other second-second element area AE2-G. Each of the first group and the second group may include four second-second light emitting areas PXA-G2.

The second-second light emitting areas PXA-G2 of the first group may be spaced apart from the second-first light emitting areas PXA-B2 in the first diagonal direction CDR1 and may be spaced apart from second-third light emitting areas PXA-R2 in the second diagonal direction CDR2.

The second-second light emitting areas PXA-G2 of the second group may be spaced apart from the second-second light emitting areas PXA-G2 of the first group in the first direction DR1, may be spaced apart from the second-first light emitting areas PXA-B2 in the second diagonal direction CDR2, and may be spaced apart from the second-third light emitting areas PXA-R2 in the first diagonal direction CDR1.

The second-second light emitting areas PXA-G2 included in each of the first and second groups may be spaced apart from each other in the first direction DR1 and the second direction DR2 or in the first diagonal direction CDR1 and the second diagonal direction CDR2.

The second-third element area AE2-R may be an area in which a first electrode AE of a second-third light emitting element LD2-R (refer to FIG. 9) providing the light having the third color is disposed. The first, second, and third colors of the light may be different from each other.

The second area A2 of the display panel 100 may include the second-third light emitting areas PXA-R2 that is an area from which the light generated by the second-third light emitting element LD2-R substantially exits.

According to an embodiment, four second-third light emitting areas PXA-R2 may be provided and may be spaced apart from each other in the first direction DR1 and the second direction DR2 or in the first diagonal direction CDR1 and the second diagonal direction CDR2.

In the present embodiment, the second-first, second-second, and second-third light emitting areas PXA-B2, PXA-G2, and PXA-R2 included in the second area A2 may be distinguished from each other by a light blocking pattern BM (refer to FIG. 9) described later. Detailed descriptions of the blocking pattern BM will be described later. In addition, a second non-light-emitting area NCA2 may be an area overlapping the light blocking pattern BM.

According to the present embodiment, a size of the first-first element area AE1-B, which provides the light having the first color, in the first area A1, may be smaller than a size of the second-first element area AE2-B, which provides the light having the first color, in the second area A2.

In addition, a size of the first-second element area AE1-G, which provides the light having the second color, in the first area A1 may be smaller than a size of the second-second element area AE2-G, which provides the light having the second color, in the second area A2, and a size of the first-third element area AE1-R, which provides the light having the third color, in the first area A1 may be smaller than a size of the second-third element area AE2-R, which provides the light having the third color, in the second area A2.

According to the present embodiment, the second-first light emitting areas PXA-B2, the second-second light emitting areas PXA-G2, and the second-third light emitting areas PXA-R2, which are included in the second area A2, may have substantially the same size.

However, the aforementioned light emitting areas should not necessarily be limited thereto or thereby, and the light emitting areas may have different sizes from each other. As an example, a size of each of the second-third light emitting areas PXA-R2 may be greater than a size of each of the second-second light emitting areas PXA-G2 and may be smaller than a size of each of the second-first light emitting areas PXA-B2.

The display device DD (refer to FIG. 1) may be operated in two modes. A first operation mode may be a state in which the light emitting elements disposed in the first-first, first-second, and first-third element areas AE1-B, AE1-G, and AE1-R of the first areas A1 and the second-first, second-second, and second-third element areas AE2-B, AE2-G, and AE2-R of the second areas A2 are activated to provide the light to a corresponding light emitting area.

A second operation mode may be a state in which the light emitting elements disposed in the first-first, first-second, and first-third element areas AE1-B, AE1-G, and AE1-R of the first areas A1 are deactivated and only the light emitting elements in the second-first, second-second, and second-third element areas AE2-B, AE2-G, and AE2-R of the second areas A2 are activated to provide the light to the corresponding light emitting area.

Accordingly, a size of the activated light emitting areas in the second operation mode may be smaller than a size of the activated light emitting areas in the first operation mode, and thus, a low pixel image may be provided to a user.

The first operation mode may correspond to a mode in which the display device DD is normally operated. The second operation mode may be used when using the display device DD for a specific purpose (e.g., to maintain privacy). As an example, when the display device DD is operated in the second operation mode, images displayed on the display area 1000A (refer to FIG. 1) are barely visible to other people near the display device DD but are visible only to the user. As a result, leakage of personal information of the user may be prevented.

When the user is looking at the display device DD from a side (e.g., when the display device DD is viewed from a shallow angle), a portion of each of the second-first, second-second, and second-third light emitting areas PXA-B2, PXA-G2, and PXA-R2 disposed in the second area A2 may be covered by the light blocking pattern BM (refer to FIG. 9) disposed thereabove, and as a result, a luminance may decrease.

FIG. 4A shows a cross-section of an area overlapping the first-first element area AE1-B in the first area A1 as a representative example. Accordingly, details of the first-first element area described with reference to the cross-section of FIG. 4A may be commonly applied to the first-second element area AE1-G and the first-third element area AE1-R of the first area A1.

FIG. 4B shows a cross-section of an area overlapping the second-first element area AB2~ B in the second area A2. Accordingly, details of the second-first element area described with reference to the cross-section of FIG. 4B may be commonly applied to the second-second element area AE2-G and the second-third element area AE2-R of the second area A2.

FIG. 4A shows the light emitting element LD1-B and a transistor TFT connected to the light emitting element LD1-B, and FIG. 4B shows the light emitting element LD2-B and a transistor TFT connected to the light emitting element LD2-B. The transistor TFT may be one of a plurality of transistors included in the driving circuit of the pixel PX (refer to FIG. 1). In the present embodiment, the transistor TFT will be described as a silicon transistor, however, according to an embodiment, the transistor TFT may be a metal oxide transistor. Hereinafter, common configurations of the first area A1 and the second area A2 will be described together.

The base layer 110 may correspond to the base layer 110 described above with reference to FIG. 3. A barrier layer 10*br* may be disposed on top of the base layer 110. The barrier layer 10*br* may prevent a foreign substance from entering thereinto from the outside. The barrier layer 10*br* may include at least one inorganic layer. The barrier layer 10*br* may include a silicon oxide layer and a silicon nitride layer. Each of the silicon oxide layer and the silicon nitride layer may be provided in plural, and the silicon oxide layers and the silicon nitride layers may be alternately stacked with each other.

A light shielding electrode BMLa may be disposed on top of the barrier layer 10*br*. The light shielding electrode BMLa may include a metal material. The light shielding electrode BMLa may include molybdenum (Mo), an alloy including molybdenum (Mo), titanium (Ti), or an alloy including titanium (Ti), which has a good heat resistance. The light shielding electrode BMLa may receive a bias voltage.

The light shielding electrode BMLa may prevent an electric potential caused by a polarization phenomenon from exerting influence on the silicon transistor TFT. The light shielding electrode BMLa may prevent an external light from reaching the silicon transistor TFT. According to an embodiment, the light shielding electrode BMLa may be a floating electrode isolated from other electrodes or lines.

A buffer layer 10*bf* may be disposed on top of the barrier layer 10*br*. The buffer layer 10*bf* may prevent metal atoms or impurities from being diffused to a semiconductor pattern disposed thereon from the base layer 110. The buffer layer 10*bf* may include at least one inorganic layer. The buffer layer 10*bf* may include a silicon oxide layer and a silicon nitride layer.

The semiconductor pattern may be disposed on top of the buffer layer 10*bf*. The semiconductor pattern may include a silicon semiconductor. As an example, the silicon semiconductor may include amorphous silicon or polycrystalline silicon. For example, the semiconductor pattern may include low temperature polycrystalline silicon.

The semiconductor pattern may include a first region having a relatively high conductivity and a second region having a relatively low conductivity. The first region may be doped with an N-type dopant or a P-type dopant. A P-type transistor may include a doped region doped with the P-type dopant, and an N-type transistor may include a doped region doped with the N-type dopant. The second region may be a non-doped region or a region doped at a concentration lower than that of the first region.

The first region may have a conductivity that is greater than that of the second region and may substantially serve as an electrode or a signal line. The second region may substantially correspond to an active area (or a channel) of the transistor. For example, a portion of the semiconductor pattern may be the active area of the transistor, another portion of the semiconductor pattern may be a source area or a drain area of the transistor, and the other portion of the semiconductor pattern may be a connection electrode or a connection signal line.

A source area SE1 (or a source), an active area AC1 (or a channel), and a drain area DEI (or a drain) of the transistor TFT may be formed from the semiconductor pattern. The source area SE1 and the drain area DEI may extend in opposite directions to each other from the active area AC1 in a cross-section.

A first insulating layer 10 may be disposed on top of the buffer layer 10*bf*. The first insulating layer 10 may commonly overlap the pixels PX (refer to FIG. 1) and may cover the semiconductor pattern. The first insulating layer 10 may include an inorganic layer and/or an organic layer and may have a single-layer or multi-layer structure.

The inorganic layer may include aluminum oxide, titanium oxide, silicon oxide, silicon nitride, silicon oxynitride, zirconium oxide, and/or hafnium oxide.

In the present embodiment, the first insulating layer 10 may have a single-layer structure of a silicon oxide layer. Not only the first insulating layer 10, but also an insulating layer of the circuit layer 120 described later may be an inorganic layer and/or an organic layer and may have a single-layer or multi-layer structure. The inorganic layer may include at least one of the above-mentioned materials, however, it should not necessarily be limited thereto or thereby.

A gate GT1 of the transistor TFT may be disposed on top of the first insulating layer 10. The gate GT1 may be a portion of a metal pattern. The gate GT1 may at least partially overlap the active area AC1. The gate GT1 may be used as a mask in a process of doping the semiconductor pattern.

The gate GT1 may include titanium (Ti), silver (Ag), an alloy including silver (Ag), molybdenum (Mo), an alloy including molybdenum (Mo), aluminum (Al), an alloy including aluminum (Al), aluminum nitride (AlN), tungsten (W), tungsten nitride (WN), copper (Cu), indium tin oxide (ITO), indium zinc oxide (IZO), or the like, however, it should not necessarily be particularly limited.

A second insulating layer 20 may be disposed on top of the first insulating layer 10 and may at least partially cover the gate GT1. A third insulating layer 30 may be disposed on top of the second insulating layer 20. A storage electrode CT may be disposed between the second insulating layer 20 and the third insulating layer 30. The storage electrode CT may at least partially overlap the gate GT1. The gate GT1 and the storage electrode CT may form a capacitor included in the driving circuit of the pixel PX (refer to FIG. 1).

A first connection electrode CNE1 may be disposed on top of the third insulating layer 30. The first connection electrode CNE1 may be connected to the drain area DEI of the transistor TFT via a contact hole defined through the first, second, and third insulating layers 10, 20, and 30.

A fourth insulating layer 40 may be disposed on top of the third insulating layer 30. A second connection electrode CNE2 may be disposed on top of the fourth insulating layer 40. The second connection electrode CNE2 may be connected to the first connection electrode CNE1 via a contact hole defined through the fourth insulating layer 40.

A fifth insulating layer 50 may be disposed on top of the fourth insulating layer 40 and may cover the second connection electrode CNE2. The stack structure of the first insulating layer 10 to the fifth insulating layer 50 is merely one example, and additional conductive layer and insulating layer may be disposed in addition to the first insulating layer 10 to fifth insulating layer 50.

Each of the fourth insulating layer 40 and the fifth insulating layer 50 may include an organic layer. As an example, the organic layer may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic-based polymer, an imide-based polymer, an aryl ether-based polymer, an amide-based polymer, a fluorine-based polymer, a p-xylene-based polymer, a vinyl alcohol-based polymer, or blends thereof.

The light emitting elements LD1-B and LD2-B may include the first electrode AE (or a pixel electrode), a light emitting layer EL, and a second electrode CE (or a common electrode). The first electrode AE may be disposed on top of the fifth insulating layer 50.

The first electrode AE may be a semi-transmissive electrode, a transmissive electrode, or a reflective electrode. According to an embodiment, the first electrode AB may include a reflective layer formed of Ag, Mg, Al, Pt, Pd, Au, Ni, Nd, Ir, Cr, or compounds thereof and a transparent or semi-transparent electrode layer formed on the reflective layer.

The transparent or semi-transparent electrode layer may include indium tin oxide (ITO), indium zinc oxide (IZO), indium gallium zinc oxide (IGZO), zinc oxide (ZnO), indium oxide (In2O3), and/or aluminum-doped zinc oxide (AZO). For instance, the first electrode AE may have a stack structure of ITO/Ag/ITO.

A hole control layer may be disposed between the first electrode AE and the light emitting layer EL. The hole control layer may include a hole transport layer and may further include a hole injection layer. An electron control layer may be disposed between the light emitting layer EL and the second electrode CE. The electron control layer may include an electron transport layer and may further include an electron injection layer.

According to the present disclosure, the first area A1 may include the pixel definition layer PDL. The pixel definition layer PDL may be disposed on top of the fifth insulating layer 50. The pixel definition layer PDL may be provided with the first opening OP1 defined therethrough to expose at least a portion of the first electrode AE of the light emitting element LD1-B. The pixel definition layer PDL of the first area A1 may cover a portion of the first electrode AE.

The first-first light emitting area PXA-B1 of the first area A1 from which the light generated by the light emitting element LD1-B is provided may be determined by a size of the first opening OP1 defined through the pixel definition layer PDL of the first area A1. An area overlapping the pixel definition layer PDL may be the first non-light-emitting area NCA1. The first non-light-emitting area NCA1 may at least partially overlap the first peripheral area NPXA1 in the first area A1.

The second area A2 may include a first pixel definition layer PDL1 and a second pixel definition layer PDL2. The first pixel definition layer PDL1 and the second pixel definition layer PDL2 may be disposed on top of the fifth insulating layer 50. The first pixel definition layer PDL1 may be provided with a second opening OP2 defined therethrough to expose at least a portion of the first electrode AE of the light emitting element LD2-B. The first pixel definition layer PDL1 of the second area A2 may cover a portion of the first electrode AE.

The second pixel definition layer PDL2 may be disposed on top of the first electrode AE exposed through the second opening OP2 without being covered by the first pixel definition layer PDL1.

In the second area A2, the second-first light emitting areas PXA-B2 from which the light generated by the light emitting element LD2-B is provided and the second non-light-emitting area NCA2 disposed between the second-first light emitting areas PXA-B2 may be distinguished from each other by the light blocking pattern BM (refer to FIG. 9) described later.

Accordingly, the first non-light-emitting area NCA1 and each of the first-first, first-second, and first-third light emitting areas PXA-B1, PXA-G1, and PXA-R1 of the first area A1 may be distinguished from each other by the pixel definition layer PDL, and the second non-light-emitting area NCA2 and each of the second-first, second-second, and second-third light emitting areas PXA-B2, PXA-G2, and PXA-R2 of the second area A2 may be distinguished from each other by the light blocking pattern BM (refer to FIG. 9) disposed on top of the display panel 100.

The encapsulation layer 140 may be disposed on top of the light emitting elements LD1-B and LD2-B. The encapsulation layer 140 may include an inorganic layer 141, an organic layer 142, and an inorganic layer 143, which are sequentially stacked, however, layers included in the encapsulation layer 140 should not necessarily be limited thereto or thereby.

The inorganic layers 141 and 143 may protect the light emitting element layer 130 from moisture and oxygen, and the organic layer 142 may protect the light emitting element layer 130 from a foreign substance such as dust particles. The inorganic layers 141 and 143 may include a silicon nitride layer, a silicon oxynitride layer, a silicon oxide layer, a titanium oxide layer, or an aluminum oxide layer. The organic layer 142 may include an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin.

Figure 5:
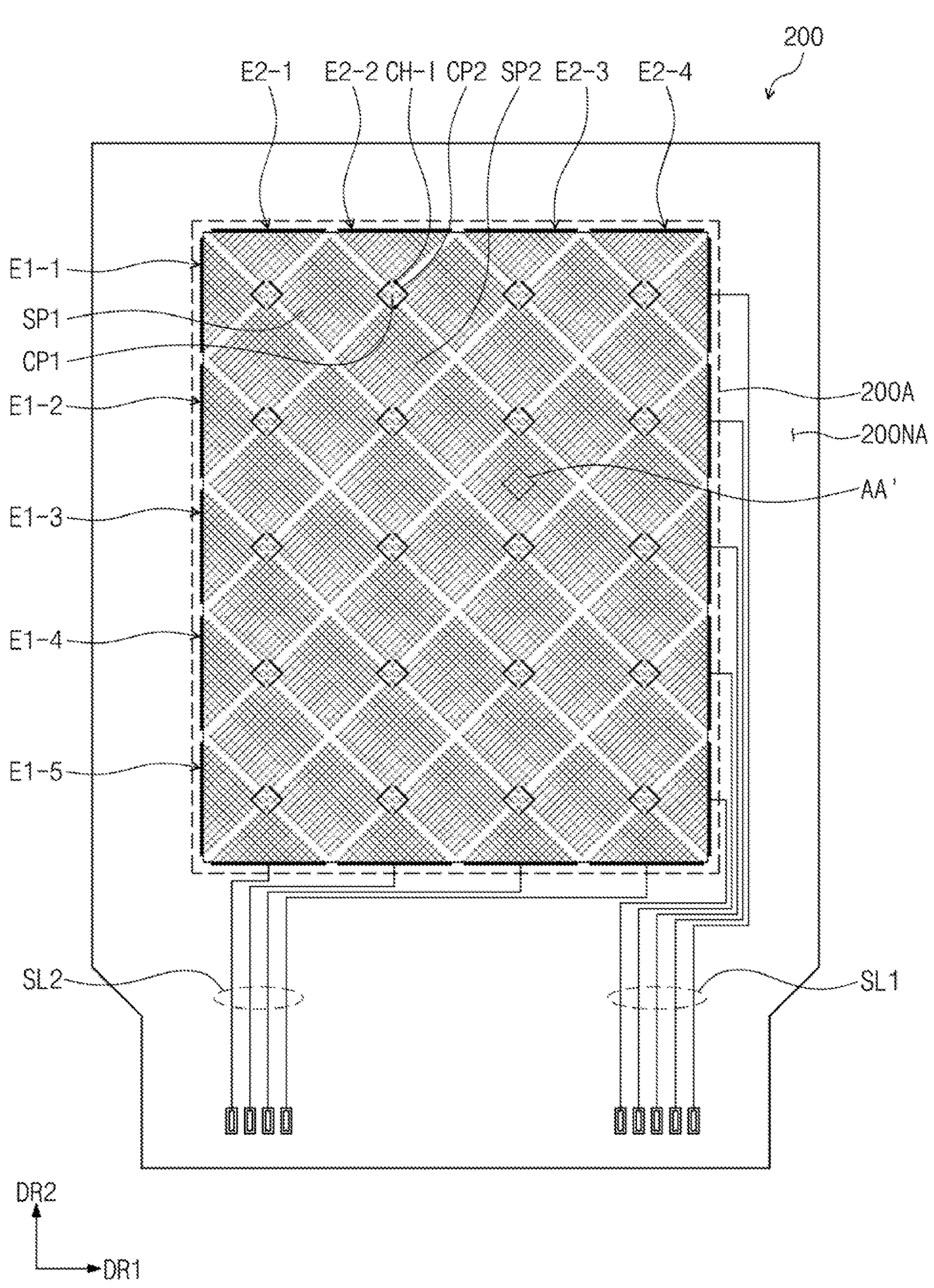
FIG. 5 is a plan view of an input sensor according to an embodiment of the present disclosure.
Figure 6A:
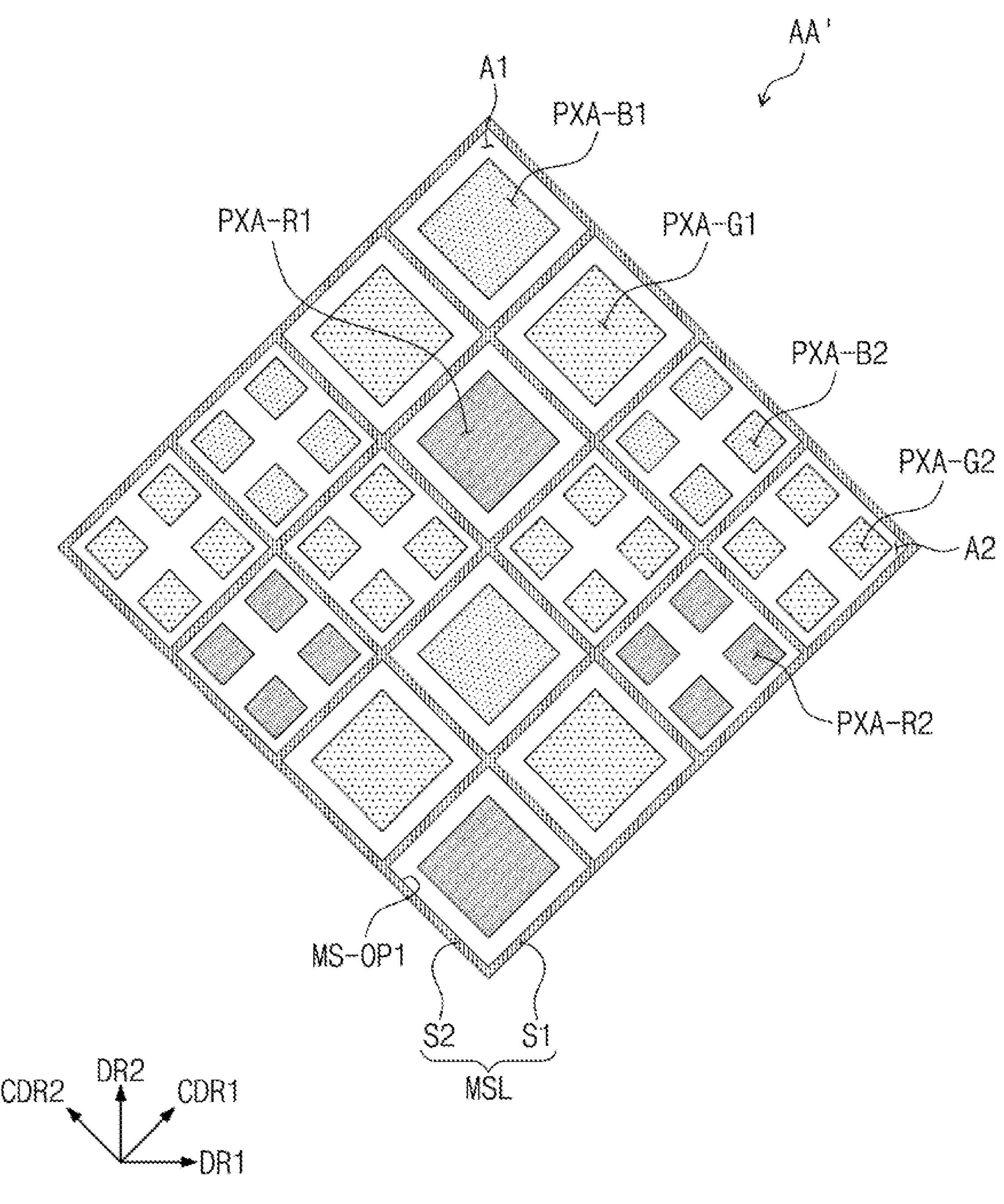
FIG. 6A is an enlarged plan view of an area AA' of FIG. 5.
Figure 6B:
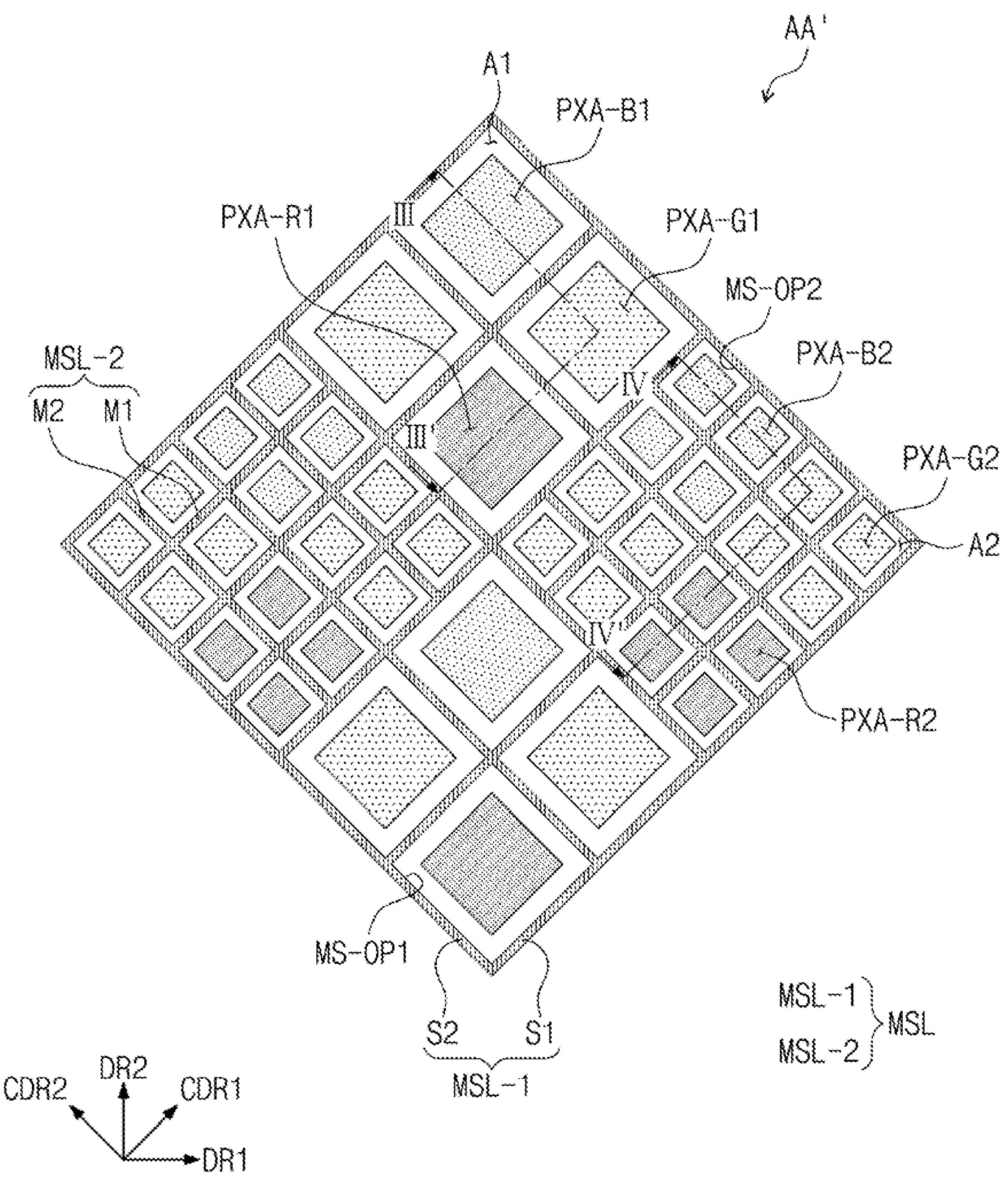
FIG. 6B is an enlarged plan view of an area AA' of FIG. 5.
Figure 7:
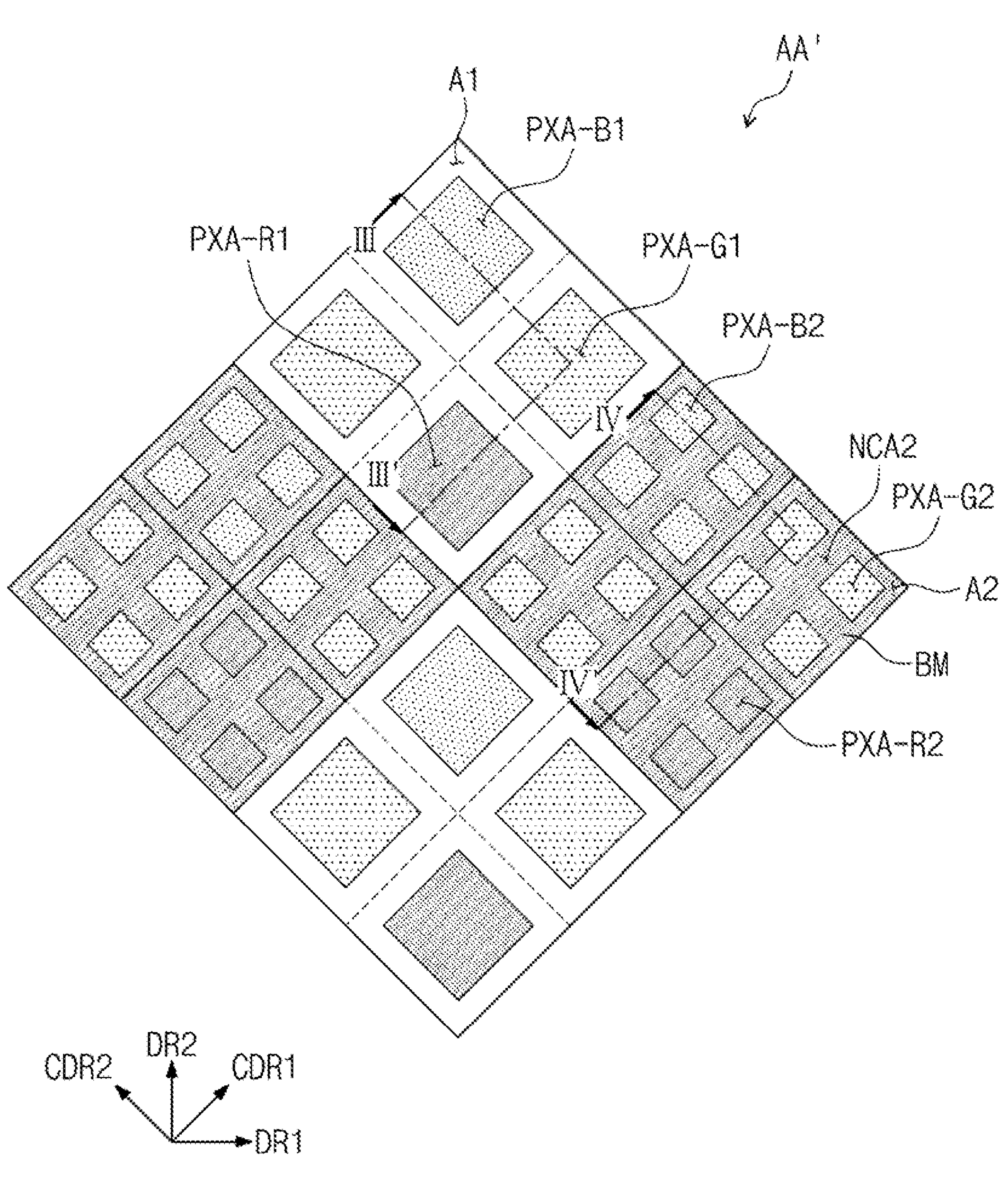
FIG. 7 is an enlarged plan view of an area AA' of FIG. 5.
Figure 8:
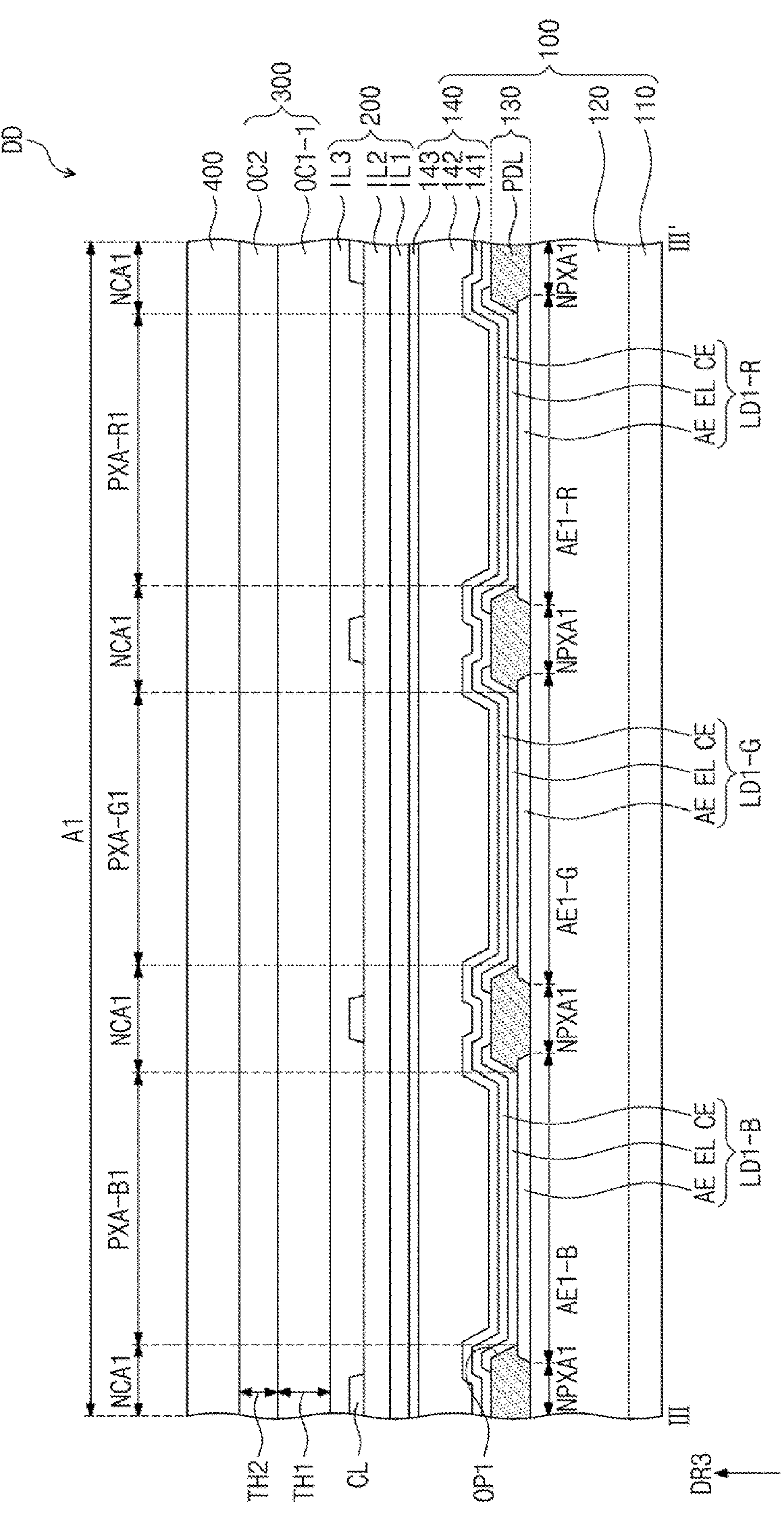
FIG. 8 is a cross-sectional view taken along a line III-III' of FIGS. 6B and 7.
Figure 9:
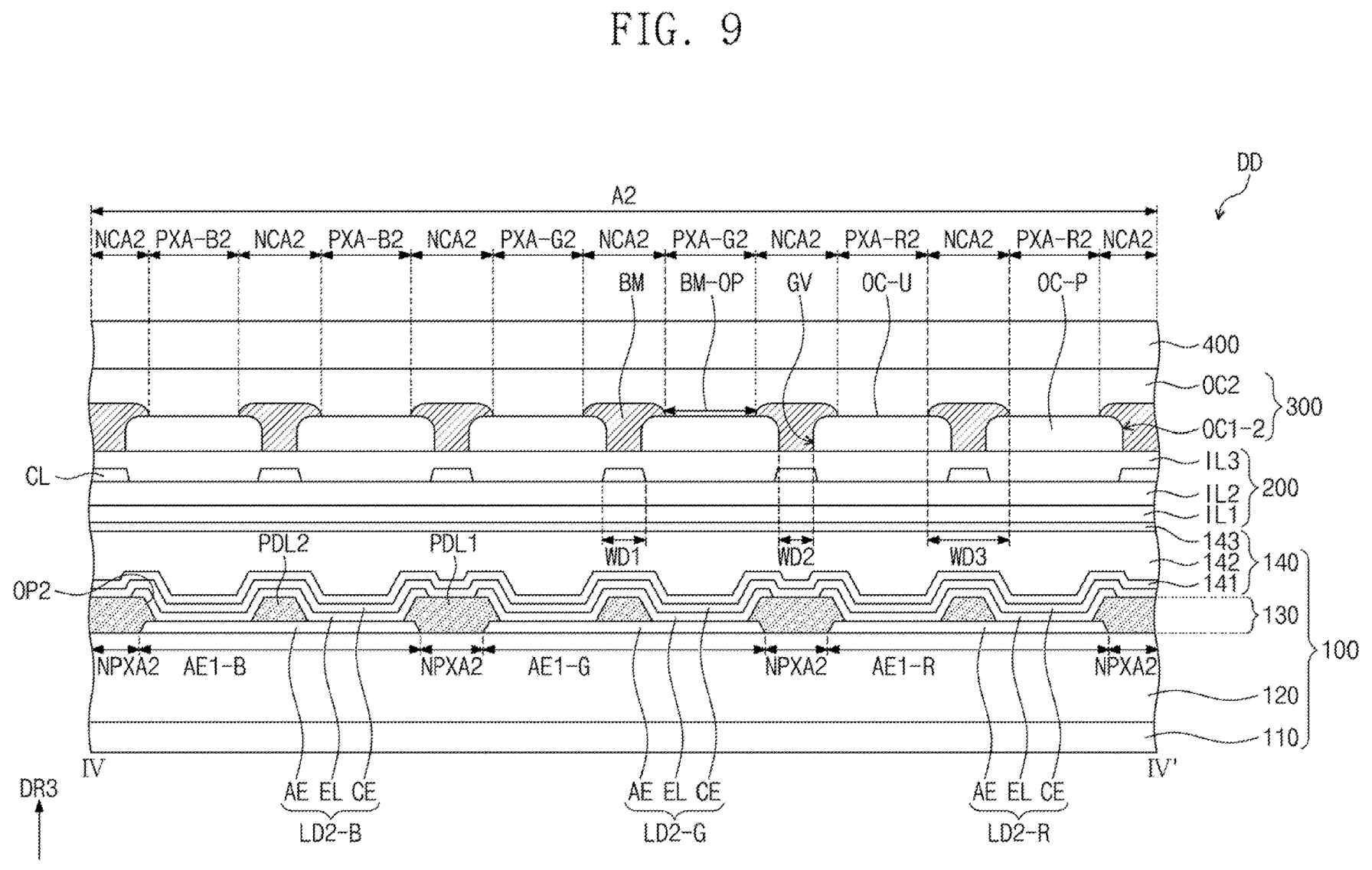
Figure 10A:
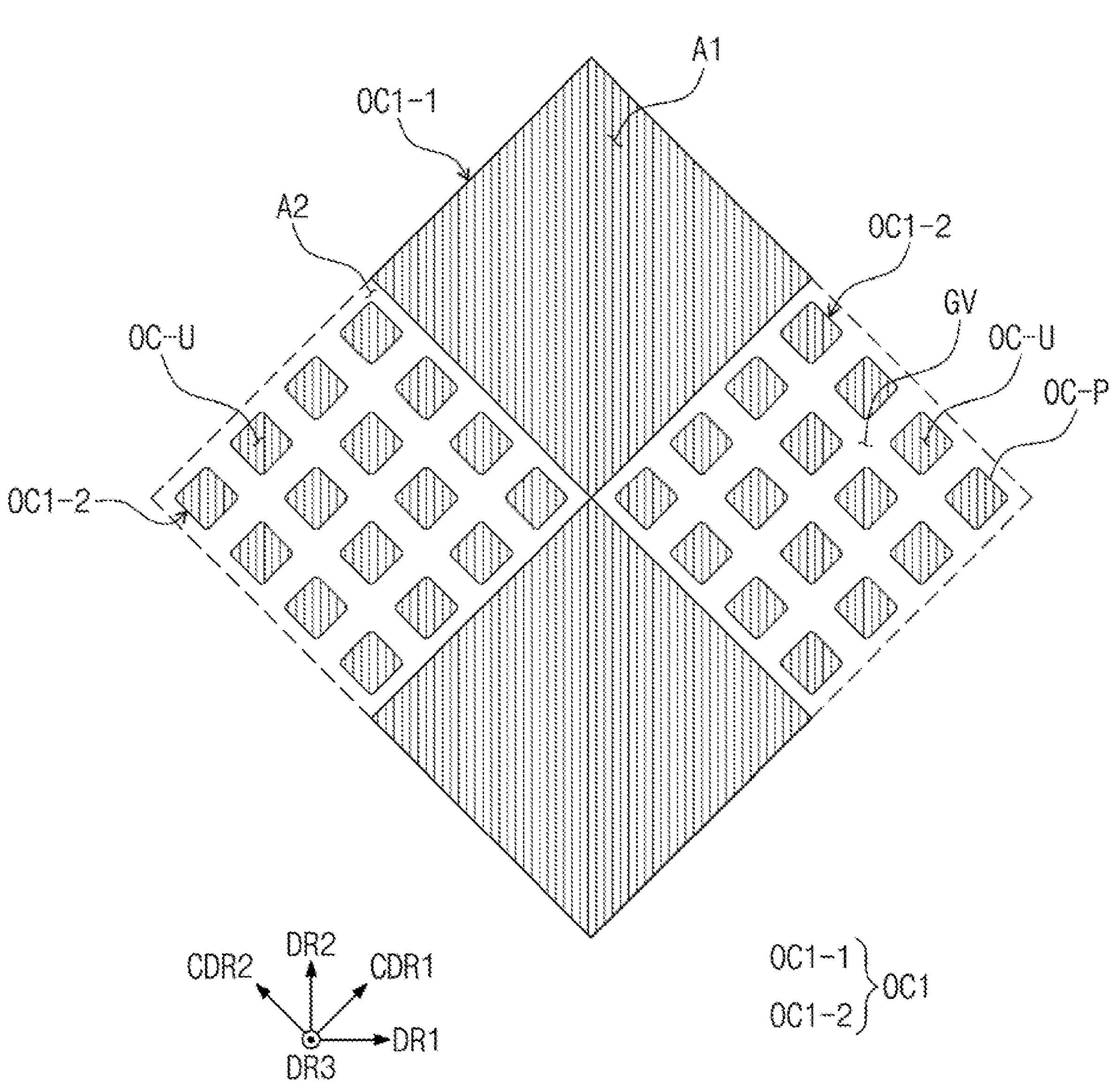
FIG. 10A is a plan view of an arrangement of a lower cover layer according to an embodiment of the present disclosure.
Figure 10B:
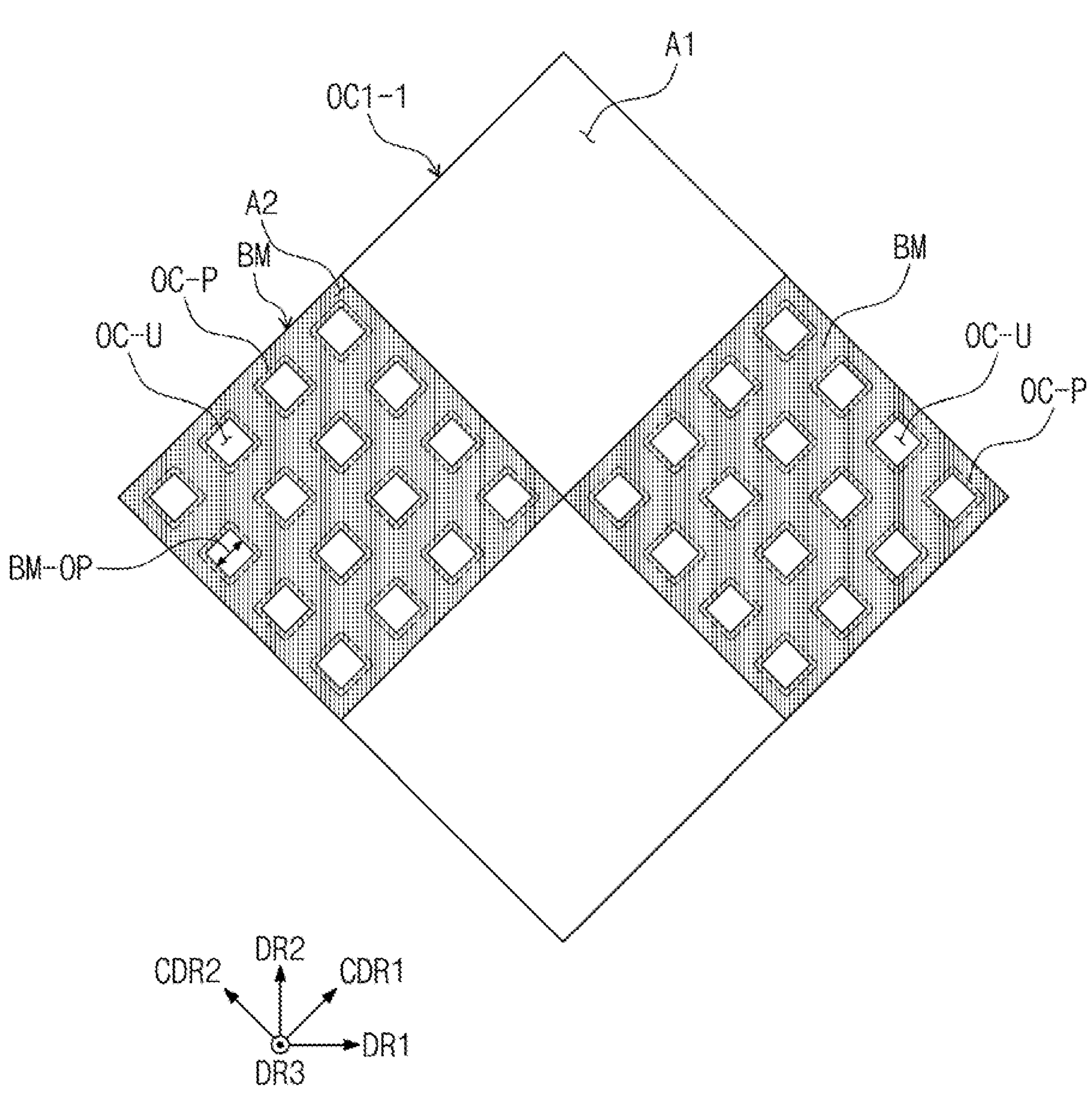
FIG. 10B is a plan view of an arrangement of a light blocking pattern according to an embodiment of the present disclosure.

FIG. 5 is a plan view of the input sensor 200 according to an embodiment of the present disclosure. FIG. 6A is an enlarged plan view of an area AA' of FIG. 5. FIG. 6B is an enlarged plan view of an area AA' of FIG. 5. FIG. 7 is an enlarged plan view of an area AA' of FIG. 5. FIG. 8 is a cross-sectional view taken along a line III-III of FIGS. 6B and 7. FIG. 9 is a cross-sectional view taken along a line IV-IV' of FIGS. 6B and 7. FIG. 10A is a plan view of an arrangement of a lower cover layer according to an embodiment of the present disclosure. FIG. 10B is a plan view of an arrangement of the light blocking pattern according to an embodiment of the present disclosure.

FIG. 5 is a plan view of the input sensor 200 according to an embodiment of the present disclosure.

Referring to FIG. 5, the input sensor 200 may include a sensing area 200A and a non-sensing area 200NA adjacent to the sensing area 200A. The sensing area 200A and the non-sensing area 200NA may correspond to the display area 1000A and the non-display area 1000N shown in FIG. 1, respectively.

The input sensor 200 may include first sensing electrodes E1-1 to E1-5 and second sensing electrodes E2-1 to E2-4, which are disposed in sensing area 200A and are insulated from each other while crossing each other. The external input may be sensed by calculating a variation in mutual capacitance formed between the first sensing electrodes E1-1 to E1-5 and the second sensing electrodes E2-1 to E2-4.

The input sensor 200 may include first signal lines SL1 disposed in the non-sensing area 200NA and electrically connected to the first sensing electrodes E1-1 to E1-5 and second signal lines SL2 disposed in the non-sensing area 200NA and electrically connected to the second sensing electrodes E2-1 to E2-4.

Each of the first sensing electrodes E1-1 to E1-5 and the second sensing electrodes E2-1 to E2-4 may include a plurality of conductive lines crossing each other. Each of the first sensing electrodes E1-1 to E1-5 and the second sensing electrodes E2-1 to E2-4 may include mesh lines. The mesh lines may be provided with a plurality of openings defined therethrough to overlap the light emitting areas included in the first area A1 and the second area A2.

One of the first sensing electrodes E1-1 to E1-5 and the second sensing electrodes E2-1 to E2-4 may be provided integrally (e.g., formed together as a singular unit). In the present embodiment, the first sensing electrodes E1-1 to E1-5 may be integrally provided. The first sensing electrodes E1-1 to E1-5 may include sensing portions SP1 and intermediate portions CP1.

Each of the second sensing electrodes E2-1 to E2-4 may include sensing patterns SP2 and bridge patterns CP2 (or connection patterns). Two sensing patterns SP2 adjacent to each other may be connected to two bridge patterns CP2 via a contact hole CH-1 defined through a second sensing insulating layer IL2 (refer to FIG. 8), however, the number of the bridge patterns should not necessarily be particularly limited.

FIGS. 6A and 6B are plan views showing an arrangement relationship between the sensing electrodes and the light emitting areas disposed in the first area A1 and the second area A2.

Referring to FIG. 6A, the sensing patterns SP2 among the first sensing electrodes E1-1 to E1-5 (refer to FIG. 5) and the second sensing electrodes B2-1 to E2-4 (refer to FIG. 5) may include mesh lines MSL extending in the first diagonal direction CDR1 and the second diagonal direction CDR2.

In the present embodiment, the mesh lines MSL may include a first line S1 and a second line S2. The first line S1 may extend in the first diagonal direction CDR1, and the second line S2 may extend in the second diagonal direction CDR2. The first lines S1 and the second lines S2 may be patterns that are integrally provided with each other, however, for the convenience of explanation, the first lines S1 and the second lines S2 will be described as being separate from each other.

As the first line S1 and the second line S2 cross each other, first mesh openings MS-OP1 may be defined through the mesh lines MSL. In the present embodiment, the first mesh openings MS-OP1 may have the same shape as each other.

In the present embodiment, each of the first-first, first-second, and first-third light emitting areas PXA-B1, PXA-G1, and PXA-R1 of the first area A1 may be at least partially surrounded by a corresponding opening among the first mesh openings MS-OP1. Accordingly, each of the first mesh openings MS-OP1 overlapping the first area A1 may at least partially surround one light emitting area.

The second-first, second-second, and second-third light emitting areas PXA-B2, PXA-G2, and PXA-R2 of the second area A2 may be provided such that light emitting areas providing the same color are at least partially surrounded by one first mesh opening MS-OP1. For example, four second-first light emitting areas PXA-B2 may be at least partially surrounded by one first mesh opening MS-OP1, four second-second light emitting areas PXA-G2 of the first group may be at least partially surrounded by another first mesh opening MS-OP1, four second-second light emitting areas PXA-G2 of the second group may be at least partially surrounded by another first mesh opening MS-OP1, and four second-third light emitting areas PXA-R2 may be at least partially surrounded by the other mesh opening MS-OP1.

Referring to FIG. 6B, the sensing patterns SP2 among the first sensing electrodes E1-1 to E1-5 (refer to FIG. 5) and the second sensing electrodes E2-1 to E2-4 (refer to FIG. 5) may include the mesh lines MSL extending in the first diagonal direction CDR1 and the second diagonal direction CDR2.

The mesh lines MSL may include first mesh lines MSL-1 and second mesh lines MSL-2. The first mesh lines MSL-1 and the second mesh lines MSL-2 may be patterns that are integrally provided with each other, however, for the convenience of explanation, the first mesh lines MSL-1 and the second mesh lines MSL-2 will be described as being separate from each other.

The first mesh lines MSL-1 may at least partially overlap the first area A1. The first mesh lines MSL-1 may include a first-first line S1 and a first-second line S2. The first-first line S1 may extend in the first diagonal direction CDR1, and the first-second line S2 may extend in the second diagonal direction CDR2.

The first mesh lines MSL-1 may correspond to the mesh lines MSL overlapping the first area A1 among the mesh lines MSL described with reference to FIG. 6A.

The second mesh lines MSL-2 may at least partially overlap the second area A2. The second mesh lines MSL-2 may include a second-first line M1 and a second-second line M2. The second-first line M1 may extend in the first diagonal direction CDR1, and the second-second line M2 may extend in the second diagonal direction CDR2.

As the second-first line M1 and the second-second line M2 cross each other, second mesh openings MS-OP2 may be defined through the second mesh lines MSL-2. In the present embodiment, the second mesh openings MS-OP2 may have substantially the same shape as each other, and each of the second mesh openings MS-OP2 has a size smaller than a size of each of first mesh openings MS-OP1.

In the present embodiment, each of the second-first, second-second, and second-third light emitting areas PXA-B2, PXA-G2, and PXA-R2 of the second area A2 may be at least partially surrounded by a corresponding opening among the second mesh openings MS-OP2. Accordingly, each of the second mesh openings MS-OP2 overlapping the second area A2 may at least partially surround one light emitting area.

FIG. 7 shows an arrangement relationship between the light blocking pattern BM disposed on top of the light control layer 300 and the light emitting areas of the first and second areas A1 and A2.

Referring to FIG. 7, the light blocking pattern BM may be disposed exclusively in the second area A2 and might not be disposed in the first area A1. According to the present disclosure, a material for the light blocking pattern BM should not necessarily be particularly limited as long as the material may absorb the light. Due to the light blocking pattern BM, a luminance ratio of the second-first, second-second, and second-third light emitting areas PXA-B2, PXA-G2, and PXA-R2 disposed in the second area A2 may be reduced when viewed from a side of the display device DD.

According to the present disclosure, when the display device DD (refer to FIG. 1) is operated in the second operation mode, the display area 1000A (refer to FIG. 1) might not be visible to people near the display device DD since the display device DD may include the light blocking pattern BM disposed in the second area A2. Accordingly, the display device DD with increased performance in the private mode may be provided.

As the light blocking pattern BM is spaced apart from the light emitting elements respectively disposed in the second-first, second-second, and second-third light emitting areas PXA-B2, PXA-G2, and PXA-R2 by a predetermined distance, when the display device DD is viewed at a specific angle, i.e., a specific angle (e.g., about 45 degrees or more) with respect to a normal line direction of the display area 1000A, a light provided from an adjacent light emitting area is leaked, and thus, a section in which the luminance ratio increases may be present.

The display panel 100, the input sensor 200, the light control layer 300, and the anti-reflective layer 400 shown in FIGS. 8 and 9 may correspond to the display panel 100, the input sensor 200, the light control layer 300, and the anti-reflective layer 400 described with reference to FIGS. 2, 4A, and 4B.

The input sensor 200 may include a first sensing insulating layer IL1, the second sensing insulating layer IL2, and a third sensing insulating layer IL3. The first sensing insulating layer IL1 may be disposed on top of the encapsulation layer 140.

Among the second sensing electrodes E2-1 to E2-4 described with reference to FIG. 5, the bridge patterns CP2 may be disposed on top of the first sensing insulating layer IL1.

The second sensing insulating layer IL2 may be disposed on top of the first sensing insulating layer IL1. Among the first sensing electrodes E1-1 to E1-5 and the second sensing electrodes E2-1 to E2-4 described with reference to FIG. 5, the sensing patterns SP2 may be disposed on top of the second sensing insulating layer IL2.

The sensing patterns SP2 may be connected to corresponding sensing patterns SP2 via a contact hole CH-1 (refer to FIG. 5) defined through the second sensing insulating layer IL2. The third sensing insulating layer IL3 may be disposed on top of the second sensing insulating layer IL2. The first, second, and third sensing insulating layers IL1, IL2, and IL3 may include an inorganic material.

Hereinafter, sensing electrodes CL described with reference to FIGS. 8 and 9 may correspond to one of the sensing patterns SP2 among the first sensing electrodes E1-1 to E1-5 and the second sensing electrodes E2-1 to E2-4.

The light control layer 300 may include a first cover layer OC1 (refer to FIG. 10A, or a lower cover layer), a second cover layer OC2 (or an upper cover layer), and the light blocking pattern BM. The first cover layer OC1 may be disposed on top of the third sensing insulating layer IL3 of the input sensor 200. In the present embodiment, a planarization layer OC1-1 disposed in the first area A1 among the first cover layer OC1 may have a first thickness TH1 greater than a second thickness TH2 of the second cover layer OC2.

Each of the first cover layer OC1 and the second cover layer OC2 may include an organic material. As an example, the organic material may include an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin.

FIG. 10A is a plan view showing a shape of the first cover layer OC1, and FIG. 10B is a plan view showing a shape of the light blocking pattern BM.

The first cover layer OC1 may include a planarization layer OC1-1 and a pattern layer OC1-2.

The planarization layer OC1-1 of the first cover layer OC1 may be disposed in the first area A1. As shown in FIG. 10A, the planarization layer OC1-1 disposed in the first area A1 may provide a flat surface on which the second cover layer OC2 (refer to FIG. 9) is disposed.

The pattern layer OC1-2 of the first cover layer OC1 may include a plurality of cover patterns OC-P. As shown in FIG. 10A, the cover patterns OC-P may be spaced apart from each other in the first diagonal direction CDR1 and the second diagonal direction CDR2. Each of the cover patterns OC-P may at least partially overlap a corresponding light emitting area among the second-first, second-second, and second-third light emitting areas PXA-B2, PXA-G2, and PXA-R2 of the second area A2.

A groove hole GV may be defined between the cover patterns OC-P. The third sensing insulating layer IL3 (refer to FIG. 9) may be exposed through the groove hole GV without being covered by the cover patterns OC-P. As shown in FIG. 10A, the groove hole GV may have a grid shape.

In the present embodiment, the light blocking pattern BM may be disposed exclusively in the second area A2. A portion of the light blocking pattern BM may be disposed in the groove hole GV. Light blocking openings BM-OP may be defined through the light blocking pattern BM. At least a portion of each of the cover patterns OC-P may be exposed through a corresponding light blocking opening among the light blocking openings BM-OP.

In the present embodiment, the light blocking pattern BM may be in contact with a portion of an upper surface OC-U of each of the cover patterns OC-P. The upper surface OC-U of each of the cover patterns OC-P covered by the light blocking pattern BM may be disposed adjacent to the second non-light-emitting area NCA2.

The light blocking pattern BM may have a width that varies in a direction to which the light provided from the second-first, second-second, and second-third light emitting areas PXA-B2, PXA-G2, and PXA-R2 is emitted, e.g., in the third direction DR3. According to an embodiment, the width of the light blocking pattern BM may increase as it goes toward the direction to which the light is emitted.

As shown in FIG. 10B, the light blocking pattern BM might not be disposed in the first area A1 and may be disposed exclusively in the second area A2. In a plan view, the light blocking pattern BM may have a shape corresponding to that of the groove hole GV and may have a size different from the of the groove hole GV. Accordingly, the shape of the light blocking pattern BM through which the light blocking openings BM-OP are defined may be the grid shape.

According to the present embodiment, as the light blocking pattern BM is not disposed in the first area A1, each of the first-first, first-second, and first-third light emitting areas PXA-B1, PXA-G1, and PXA-R1 from which the light is provided in the first area A1 may have a size corresponding to a size of a corresponding opening among the first openings OP1 defined through the pixel definition layer PDL of the first area A1. In addition, the first non-light-emitting area NCA1 may be an area overlapping the pixel definition layer PDL.

As the light blocking pattern BM is disposed in the second area A2, the second non-light-emitting area NCA2 may be an area overlapping the light blocking pattern BM, and the second-first, second-second, and second-third light emitting areas PXA-B2, PXA-G2, and PXA-R2 may correspond to the size of the light blocking openings BM-OP.

In the present embodiment, the sensing electrodes CL may have a first width WD1 equal to or greater than a second width WD2 of the light blocking pattern BM. The second width WD2 may be a width of the light blocking pattern BM that is in contact with the third sensing insulating layer IL3. However, the relationship between the first width WD1 of the sensing electrodes CL and the second width WD2 of the light blocking pattern BM should not necessarily be limited thereto or thereby, and according to another embodiment, the first width WD1 of the sensing electrodes CL may be smaller than the second width WD2 of the light blocking pattern BM.

In addition, a third width WD3 of the light blocking pattern BM covering a portion of the upper surface OC-U of each of the cover patterns OC-P adjacent to each other may be greater than the first width WD1 and the second width WD2.

In the present embodiment, the second width WD2 may be a minimum width of the light blocking pattern BM, and the third width WD3 may be a maximum width of the light blocking pattern BM. The second non-light-emitting area NCA2 may correspond to the third width WD3 that is the maximum width of the light blocking pattern BM.

As the portion of the light blocking pattern BM is disposed in the groove hole GV formed by removing a portion of the pattern layer OC1-2, the portion of the light blocking pattern BM may be provided in a barrier wall shape having the same thickness as the pattern layer OC1-2.

As the light blocking pattern BM disposed in the second area A2 is provided in the barrier wall shape with a predetermined thickness, when the display device DD (refer to FIG. 1) is viewed at an angle greater than or equal to a specific angle with respect to the normal line direction of the display area 1000A (refer to FIG. 1), the leakage of the light provided from the adjacent light emitting area may be prevented by the thickness of the light blocking pattern BM. Accordingly, the display device DD may have a uniform color purity when viewed from the specific angle.

In addition, as the light blocking pattern BM has the width that increases along the direction to which the light is emitted, a defect in which the sensing electrodes CL are visible at the specific angle may be prevented.

Figure 11:
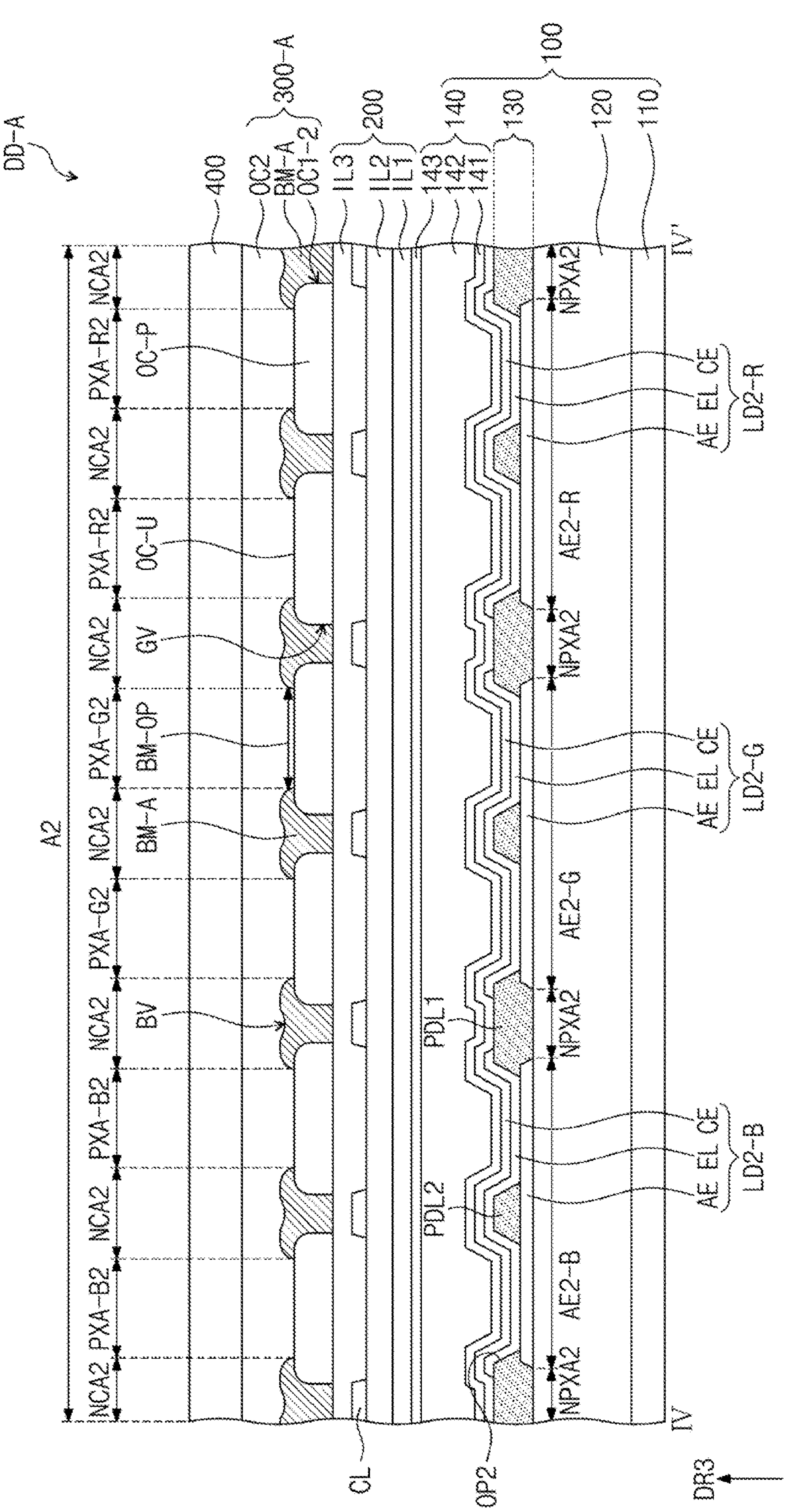
FIG. 11 is a cross-sectional view of a display device according to an embodiment of the present disclosure.
Figure 12A:
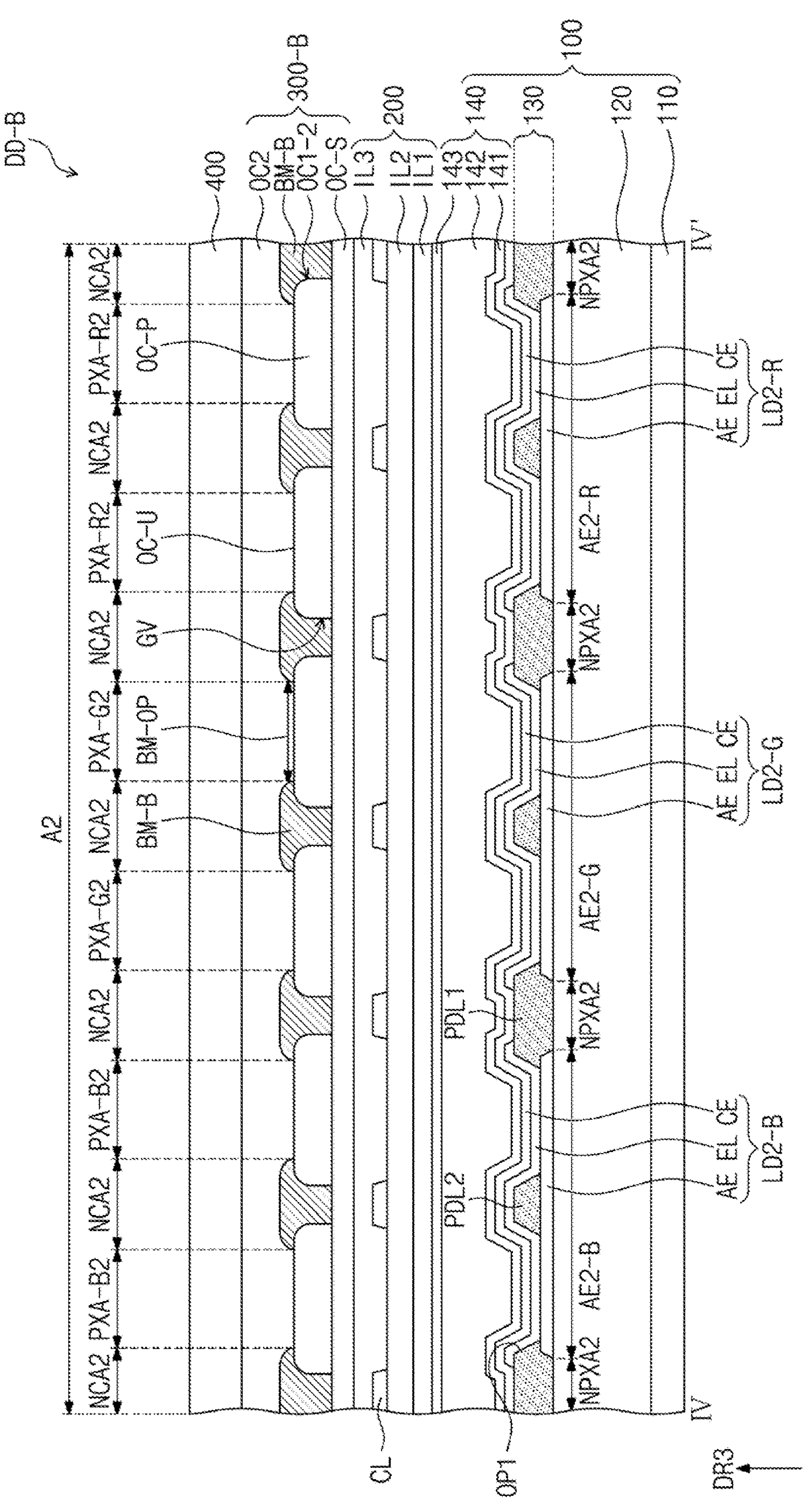
FIG. 12A is a cross-sectional view of a display device according to an embodiment of the present disclosure.
Figure 12B:
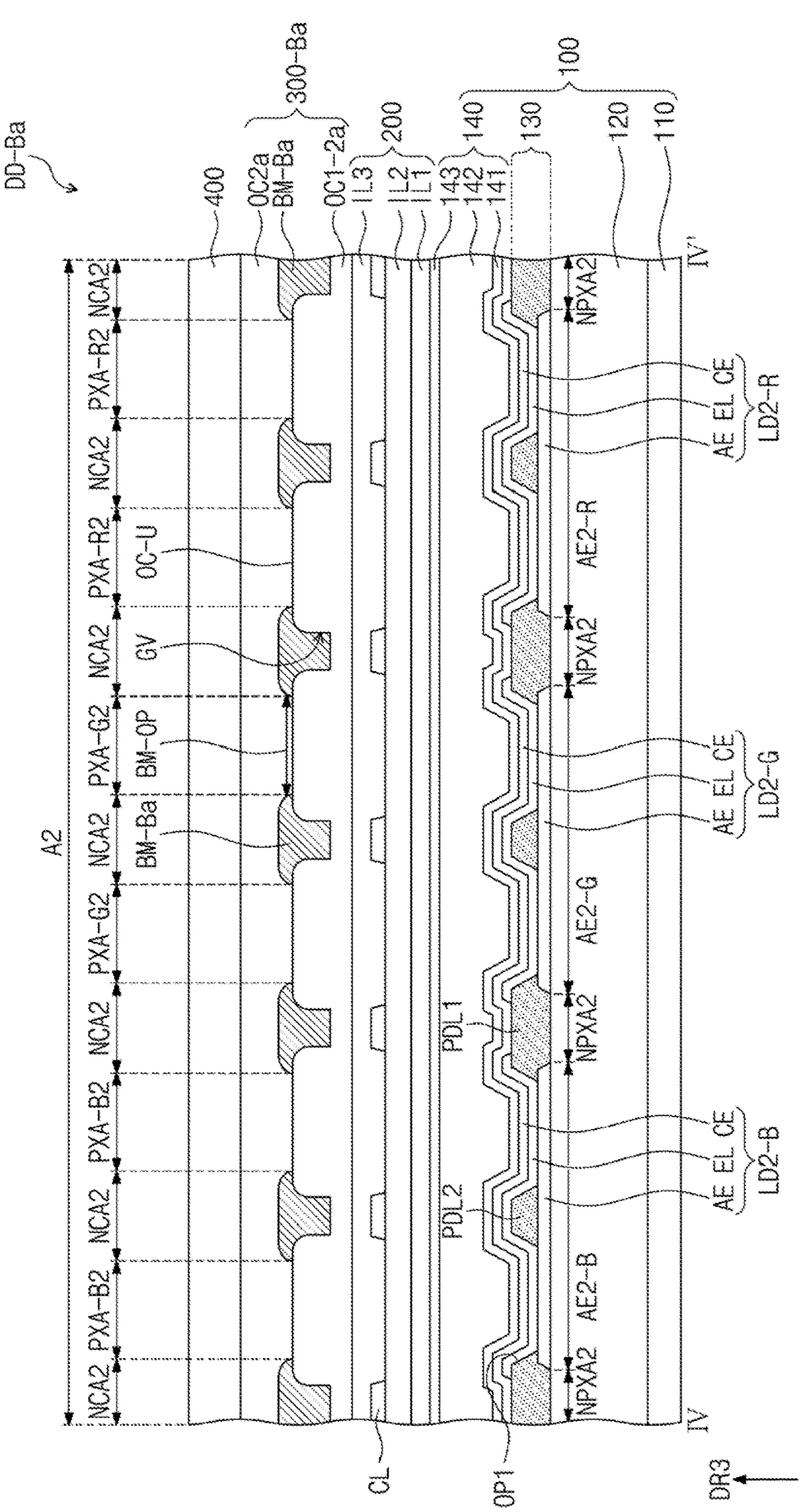
FIG. 12B is a cross-sectional view of a display device according to an embodiment of the present disclosure.

FIG. 11 is a cross-sectional view of a display device DD-A according to an embodiment of the present disclosure. FIG. 12A is a cross-sectional view of a display device DD-B according to an embodiment of the present disclosure. FIG. 12B is a cross-sectional view of a display device DD-Ba according to an embodiment of the present disclosure. FIG. 13 is a cross-sectional view of a display device DD-C according to an embodiment of the present disclosure. In FIGS. 11 to 13, the same/similar reference numerals denote the same/similar elements in FIGS. 1 to 10B, and thus, to the extent that a detailed description of an element is omitted, it may be assumed that the element is at least similar to a corresponding element that has been described elsewhere within the present disclosure.

Hereinafter, configurations of a display panel 100, an input sensor 200, an anti-reflective layer 400, and a window included in the display devices DD-A, DD-B, DD-Ba, and DD-C shown in FIGS. 11 to 13 may correspond to those of the display panel 100, the input sensor 200, the anti-reflective layer 400, and the window 500 of the display device DD described above, and thus, to the extent that a detailed description of an element is omitted, it may be assumed that the element is at least similar to a corresponding element that has been described elsewhere within the present disclosure.

Referring to FIG. 11, a light control layer 300-A may include a first cover layer OC 1 (refer to FIG. 10A), a second cover layer OC2, and a light blocking pattern BM-A. Details of the first cover layer OC1 and the second cover layer OC2 are the same as the details of the first cover layer OC1 and the second cover layer OC2 described with reference to FIGS. 8 and 9. FIG. 11 shows only a pattern layer OC1-2 of the first cover layer OC1 disposed in a second area A2.

The light blocking pattern BM-A may overlap a second non-light-emitting area NCA2 of the second area A2. The light blocking pattern BM-A may be disposed in a groove hole GV defined through the pattern layer OC1-2, and light blocking openings BM-OP may be defined.

The light blocking pattern BM-A may be in contact with a portion of an upper surface OC-U of each of cover patterns OC-P. The upper surface OC-U of each of the cover patterns OC-P covered by the light blocking pattern BM-A may be disposed adjacent to the second non-light-emitting area NCA2.

In the present embodiment, the light blocking pattern BM-A may include a concave portion BV. The concave portion BV may be concaved in a direction toward the groove hole GV. The concave portion BV may be formed during a process of filling a light blocking material into the groove hole GV.

Referring to FIG. 12A, a light control layer 300-B included in the display device DD-B may include a first cover layer OC1 (refer to FIG. 10A), a second cover layer OC2, and a light blocking pattern BM-B. Details of the first cover layer OC1 and the second cover layer OC2 are the same as the details of the first cover layer OC1 and the second cover layer OC2 described with reference to FIGS. 8 and 9. FIG. 12A shows a pattern layer OC1-2 of the first cover layer OC1 disposed in a second area A2.

The light blocking pattern BM-B may further include an additional cover layer OC-S disposed between a third sensing insulating layer IL3 of the input sensor 200 and the pattern layer OC1-2. Accordingly, the light blocking pattern BM-B may be in contact with the additional cover layer OC-S. The additional cover layer OC-S may have a thickness that is smaller than a thickness of the first cover layer OC1 and the second cover layer OC2.

The additional cover layer OC-S may include an organic material. The organic material may include an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin.

The additional cover layer OC-S may be disposed exclusively in the second area A2. In this case, the third sensing insulating layer IL3 may be in contact with a planarization layer OC1-1 (refer to FIG. 8) in a first area A1, however, it should not necessarily be limited thereto or thereby. The additional cover layer OC-S may be commonly disposed in the first area A1 and the second area A2.

Referring to FIG. 12B, a light control layer 300-Ba included in the display device DD-Ba may include a first cover layer OC1 (refer to FIG. 10A), a second cover layer OC2*a*, and a light blocking pattern BM-B. Details of the first cover layer OC1 and the second cover layer OC2*a* are the same as the details of the first cover layer OC1 and the second cover layer OC2 described with reference to FIGS. 8 and 9. FIG. 12B shows a pattern layer OC1-2*a* of the first cover layer OC1 disposed in a second area A2.

At least a portion of the light blocking pattern BM-Ba may be disposed in the pattern layer OC1-2*a*. As an example, at least a portion of the light blocking pattern BM-Ba, which has a uniform width in a groove hole GV, may be disposed in the pattern layer OC1-2*a*, and the other portion of the light blocking pattern BM-Ba may be protruded from an upper surface OC-U of the cover pattern to the third direction DR3. The protruded portion may be covered by the second cover layer OC2*a*.

According to the present embodiment, as the light blocking pattern BM-Ba is disposed in the pattern layer OC1-2*a*, the light blocking pattern BM-Ba may be spaced apart from a third sensing insulating layer IL3.

The pattern layer OC1-2*a* may include an organic material. The organic material may include an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin. The pattern layer OC1-2*a* may be formed by stacking a plurality of organic layers. In this case, the organic layers may include the same material as each other. Accordingly, boundaries between the organic layers might not be visible, and the organic layers may be formed as the single pattern layer OC1-2*a* as shown in FIG. 12B.

Referring to FIG. 13, a light control layer 300-C may include a first cover layer OC1, a second cover layer OC2, a third cover layer OC3, and a light blocking portion BM-C. The light blocking portion BM-C may include a first light blocking pattern BM1 and a second light blocking pattern BM2, which are disposed on different layers. The light blocking portion BM-C may be disposed exclusively in a second area A2.

The first cover layer OC1 may be disposed on a third sensing insulating layer IL3. The first light blocking pattern BM1 may be disposed on top of the first cover layer OC1.

The first light blocking pattern BM1 may overlap a second non-light-emitting area NCA2. First light blocking openings BM-OP1 may be defined through the first light blocking pattern BM1. Each of the first light blocking openings BM-OP1 may overlap a corresponding light emitting area among second-first, second-second, and second-third light emitting areas PXA-B2, PXA-G2, and PXA-R2.

The second cover layer OC2 may be disposed on top of the first cover layer OC1 and may cover the first light blocking pattern BM1.

The second light blocking pattern BM2 may at least partially overlap the first light blocking pattern BM1. Second light blocking openings BM-OP2 may be defined through the second light blocking pattern BM2. Each of the second light blocking openings BM-OP2 may at least partially overlap a corresponding opening among the first light blocking openings BM-OP1.

In the present embodiment, sensing electrodes CL may have a fourth width WD4, the first light blocking pattern BM1 may have a fifth width WD5, and the second light blocking pattern BM2 may have a sixth width WD6.

The fifth width WD5 may be greater than the fourth width WD4 and may be smaller than the sixth width WD6. Accordingly, a size of each of the second light blocking openings BM-OP2 may be smaller than a size of each of the first light blocking openings BM-OP1. Accordingly, the second non-light-emitting area NCA2 of the second area A2 may be an area overlapping the second light blocking pattern BM2.

In the present embodiment, as the first light blocking pattern BM1 is disposed closer to second-first, second-second, and second-third element areas AE2-B, AE2-G, and AE2-R than the second light blocking pattern BM2 is, when the display device DD-C is viewed at an angle equal to or greater than a specific angle, the leakage of the light provided from the adjacent light emitting area may be prevented. Accordingly, the display device DD-C may have a uniform color purity when viewed from the specific angle.

In addition, as the second light blocking pattern BM2 having the width that is greater than that of the first light blocking pattern BM1 is disposed above the first light blocking pattern BM1, a defect in which the sensing electrodes CL are visible at the specific angle may be prevented.

Figure 14:
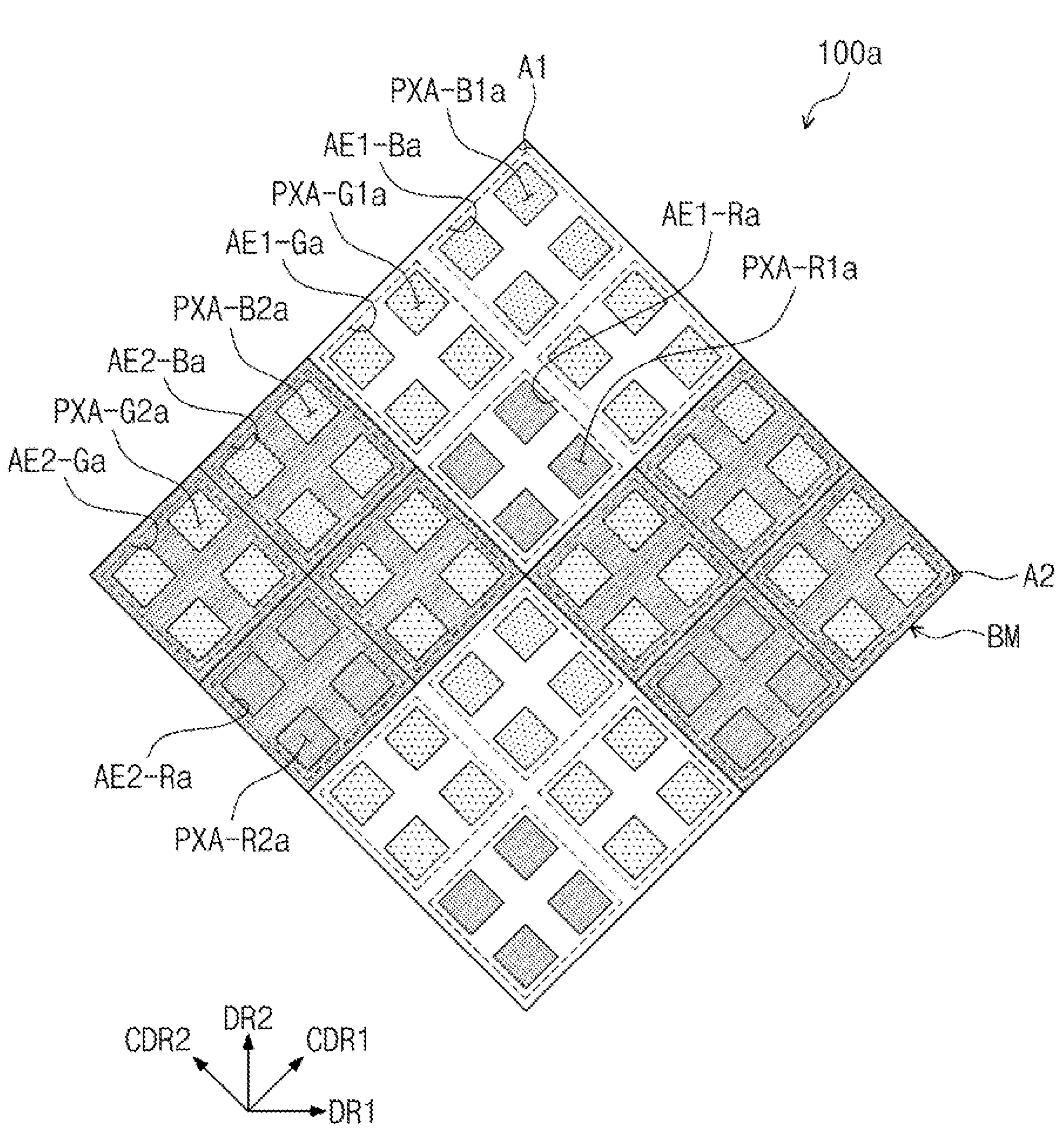
FIG. 14 is a cross-sectional view of a display device according to an embodiment of the present disclosure.

FIG. 14 is a plan view of a display panel according to an embodiment of the present disclosure. In FIG. 14, the same/similar reference numerals denote the same/similar elements in FIGS. 1 to 10B, and thus, to the extent that a detailed description of an element has been omitted, it may be assumed that the element is at least similar to a corresponding element that has been described elsewhere within the present disclosure.

In the present embodiment, the display panel 100*a* may include a first area A1 and a second area A2. The light blocking pattern BM (refer to FIG. 7) may be disposed exclusively in the second area A2 and might not be disposed in the first area A1.

The first area A1 may include first-first, first-second, and first-third element areas AE1-Ba, AE1-Ga, and AE1-Ra and a first peripheral area NPXA1. The second area A2 may include second-first, second-second, and second-third element areas AE2-Ba, AE2-Ga, and AE2-Ra and a second peripheral area NPXA2.

In the present embodiment, the first area A1 may include four first-first light emitting areas PXA-B1*a*. The first area A1 may include two groups of four first-second light emitting areas PXA-G1*a*. The first area A1 may include four first-third light emitting areas PXA-R1*a*.

In the present embodiment, the first-first, first-second, and first-third light emitting areas PXA-B1*a*, PXA-G1*a*, and PXA-R1*a* may have the same size as each other.

In the present embodiment, the second area A2 may include four second-first light emitting areas PXA-B2*a*. The second area A2 may include two groups of four second-second light emitting areas PXA-G2*a*. The second area A2 may include four second-third light emitting areas PXA-R2*a*. The second-first, second-second, and second-third light emitting areas PXA-B2*a*, PXA-G2*a*, and PXA-R2*a* may have the same size as each other.

According to the present embodiment, a size of the first-first element area AE1-Ba generating a light having a first color may be the same as a size of the second-first element area AE2-Ba. A size of the first-second element area AE1-Ga generating a light having a second color may be the same as a size of the second-second element area AE2-Ga. A size of the first-third element area AE1-Ra generating a light having a third color may be the same as a size of the second-third element area AE2-Rb.

Although the embodiments of the present disclosure have been described herein with reference to the figures, it is understood that the present disclosure should not necessarily be limited to these embodiments but various changes and modifications can be made by one ordinary skilled in the art within the spirit and scope of the present disclosure.

What is claimed is:

1. A display device, comprising:

a display panel comprising first and second areas each comprising element areas in which light emitting elements are disposed and a peripheral area, the first area comprising a plurality of light emitting areas, the second area comprising a plurality of light emitting areas respectively overlapping the element areas and a non-light-emitting area at least partially surrounding the light emitting areas such that at least a portion of the non-light-emitting area overlaps the peripheral area;

a lower cover layer disposed on the display panel, overlapping the first area and the second area, and comprising cover patterns respectively overlapping the light emitting areas of the second area; and a light blocking pattern overlapping the non-light-emitting area and disposed on the lower cover layer overlapping the second area, wherein the light blocking pattern covers a portion of an upper surface of each of the cover patterns, wherein the light emitting areas of the second area are smaller than the light emitting areas of the first area.

2. The display device of claim 1, wherein the light blocking pattern has a width that varies along a thickness direction of the display panel.

3. The display device of claim 1, wherein an upper surface of the light blocking pattern has a concave shape that is concaved in a direction toward the display panel.

4. The display device of claim 1, further comprising an input sensor disposed between the display panel and the lower cover layer, the input sensor comprising sensing electrodes and sensing insulating layers, wherein the sensing electrodes overlap the peripheral area.

5. The display device of claim 4, wherein the light blocking pattern is in contact with an uppermost sensing insulating layer, among the sensing insulating layers, that is closest to the lower cover layer.

6. The display device of claim 4, wherein each of the sensing electrodes has a width that is smaller than a maximum width of the light blocking pattern.

7. The display device of claim 4, wherein at least a portion of the light blocking pattern is disposed in the lower cover layer, and the light blocking pattern is spaced apart from an uppermost sensing insulating layer, among the sensing insulating layers, closest to the lower cover layer.

8. The display device of claim 4, further comprising an additional cover layer disposed between an uppermost sensing insulating layer closest to the lower cover layer, among the sensing insulating layers, and the lower cover layer, wherein the light blocking pattern is in contact with the additional cover layer.

9. The display device of claim 4, wherein the sensing electrodes do not overlap a portion between the light emitting areas adjacent to each other among the light emitting areas of the second area.

10. The display device of claim 1, wherein the light blocking pattern has a grid shape in which light blocking openings overlap the light emitting areas of the second area, and each of the cover patterns overlaps a corresponding light blocking opening among the light blocking openings.

11. The display device of claim 1, wherein the light emitting areas of the second area have a same size as each other.

12. The display device of claim 1, wherein each of the light emitting elements comprises a first electrode, a second electrode, and a light emitting layer disposed between the first electrode and the second electrode, and the display panel comprises a first pixel definition layer through which openings expose at least a portion of each of the first electrodes.

13. The display device of claim 12, wherein the display panel of the second area comprises a second pixel definition layer disposed on the first electrodes exposed through the openings and overlapping the non-light-emitting area.

14. The display device of claim 13, wherein the light emitting areas of the first area respectively overlap the element areas and a non-light-emitting area surrounding the light emitting areas such that at least a portion of the non-light-emitting area overlaps the peripheral area.

15. The display device of claim 14, wherein the light emitting areas of the first area have a same size as each other.

16. The display device of claim 1, wherein the display panel activates the light emitting elements of the first area and the light emitting elements of the second area in a first operation mode, deactivates the light emitting elements of the first area in a second operation mode, and activates the light emitting elements of the second area in the second operation mode.

* * * * *